(12) United States Patent     (10) Patent No.: US 7,474,050 B2
Kaneda et al.     (45) Date of Patent: Jan. 6, 2009

(54) LIGHT EMITTING DEVICE, AND LIGHTING SYSTEM, BACKLIGHT FOR DISPLAY AND DISPLAY USING THE SAME

(75) Inventors: Hideaki Kaneda, Ibaraki (JP); Naoto Kijima, Kanagawa (JP); Eiji Hattori, Tokyo (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/631,396

(22) PCT Filed: Jun. 29, 2005

(86) PCT No.: PCT/JP2005/011939

§ 371 (c)(1), (2), (4) Date: May 9, 2007

(87) PCT Pub. No.: WO2006/003930

PCT Pub. Date: Jan. 12, 2006

(65) Prior Publication Data

US 2007/0222360 A1    Sep. 27, 2007

(30) Foreign Application Priority Data

Jun. 30, 2004    (JP)   ............................. 2004-194153

(51) Int. Cl.
*H05B 33/00* (2006.01)
*H01J 1/62* (2006.01)
(52) U.S. Cl. ....................................... 313/504; 313/512
(58) Field of Classification Search .......... 313/504–512
See application file for complete search history.

(56) References Cited

U.S. PATENT DOCUMENTS

| 5,611,959 | A | 3/1997 | Kijima et al. |
| 6,712,993 | B2 | 3/2004 | Kijima et al. |
| 7,001,537 | B2 | 2/2006 | Kijima et al. |
| 7,006,172 | B2 | 2/2006 | Kawana et al. |
| 2004/0251809 | A1 | 12/2004 | Shimomura et al. |
| 2005/0145854 | A1 | 7/2005 | Seto et al. |

FOREIGN PATENT DOCUMENTS

JP    2000 194285    7/2000

(Continued)

*Primary Examiner*—Joseph L Williams
(74) *Attorney, Agent, or Firm*—Oblon, Spivak, McClelland, Maier & Neustadt, P.C.

(57) ABSTRACT

A light emitting device for enhancing emission efficiency and color rendering, comprising: a light source; a first emitting section having a luminescent material emitting light including a wavelength component longer than that of light from the light source when excited by the light from the light source; a second emitting section having a luminescent material emitting light including a wavelength component longer than that of the light from the first emitting section when excited by the lights from the light source and the first emitting section; and a light exit side from which the light from the light source, the first light-emitting section and the second light-emitting section emerges outside; and the first emitting section and the second emitting section are opened at the light exit side, and an area of a boundary surface between the first emitting section and the second emitting section is equal to or less than fifty percent of the surface area of the first emitting section.

28 Claims, 7 Drawing Sheets

FOREIGN PATENT DOCUMENTS

| | | |
|---|---|---|
| JP | 2001 184921 | 7/2001 |
| JP | 2003 64358 | 3/2003 |
| JP | 2004 71357 | 3/2004 |
| JP | 2004 71726 | 3/2004 |
| JP | 2005 243699 | 9/2005 |
| JP | 2006 8721 | 1/2006 |
| WO | 2006 003931 | 1/2006 |
| WO | 2006 003932 | 1/2006 |

LIGHT EMITTING DEVICE, AND LIGHTING SYSTEM, BACKLIGHT FOR DISPLAY AND DISPLAY USING THE SAME

CROSS-REFERENCE TO RELATED APPLICATIONS

The present application is a 35 U.S.C. § National Stage patent application of International patent application PCT/JP05/011939, file on Jun. 29, 2005, which claims priority to Japanese patent application JP2004-194153, file on Jun. 30, 2004.

TECHNICAL FIELD

The present invention relates to a light emitting device, and relates to a lighting system, backlight for a display and a display using the same.

BACKGROUND ART

Conventionally, a cold-cathode tube was, for example, used as a light source for a lighting system or a liquid crystal display backlight and the like. But in recent years, a pseudo-white light source, which is a combination of a light source emitting blue light and a material absorbing blue light and emitting yellow light, has been developed as an alternative light source. In this pseudo-white light source, an InGaN base light-emitting diode is used as a light source emitting blue light and cerium-activated yttrium aluminate is used as a material emitting yellow light, for example.

However, there are intrinsic insufficiency of green light and red light components in the spectrum of the light emitted from the pseudo-white light source, thereby the pseudo-white light source is low in color rendering, as well as in color reproduction. In order to solve this problem, the way of enhancing the color rendering and the color reproduction is proposed by means of adjusting the component of yttrium aluminate (that is the material emitting yellow light) for the purpose of improving it to emit yellow-green light and, at the same time, adding a material that absorb blue light and emit red light to the yttrium aluminate for the purpose of make up the shortage of the red light component of the pseudo-white light source.

However, materials emitting red light often absorb not only blue light but also lights with wavelength components longer than that of blue light and shorter than red light, or green to yellow light. The examples of such materials are alkaline-earth metals sulfide activated by europium, nitride of alkaline-earth metals and silicon activated by europium, oxynitride of alkaline-earth metals and silicon activated by europium or the like. These materials generally absorbs 400 nm to 580 nm wavelength light efficiently, and emit orange to red light, of which wavelength peak is located at about 580 nm to 680 nm.

Materials emitting orange to red light, typified by the above-mentioned ones, absorb the lights with shorter wavelengths than those of themselves, or green to yellow lights. Therefore, in case materials emitting orange to red light and materials emitting green to yellow light are used together, the orange to red light material absorbs a part of the light from green to yellow light material, thereby the luminous flux of the light emitting device gets remarkably lowered.

Several solutions are being tested at present, in which the reduction in luminous flux, occurred from the absorption of shorter-wavelength light into the materials emitting longer-wavelength light, could be prevented. For example, Patent Document 1 discloses that, in a light emitting device comprising two sorts of materials (here called, "material A" and "material B") that absorb the light from a light source and emit lights with different wavelengths respectively, when the material A (which corresponds to a material emitting orange to red light) absorb a part of the light emitted from the material B (which corresponds to a material emitting green to yellow light), the improvement in color rendering and the prevention of reduction in luminous flux can be achieved by locating the material A closer to the light source than the material B is.

[Patent Document 1] Japanese Patent Laid-Open Publication (Kokai) No. 2004-71726

DISCLOSURE OF THE INVENTION

Problem to Be Solved by the Invention

However, in the art of Patent Document 1, because the light emitted from the material A and the material B emerges on all sides, most (around half) of the light emitted from the material B is absorbed in the material A and thus the remarkable decrease in luminous flux should be unavoidable. Thereby, the emission efficiency of the light emitting device remains low.

On the other hand, a light emitting device like a pseudo-white light source, which comprises a light source emitting blue light and a material absorbing blue light and emitting yellow light, has not efficient color rendering, though it has substantially high emission efficiency, as mentioned above.

The present invention has been made in view of such problems as mentioned above. The object of the invention is to enhance the emission efficiency and the color rendering of a light emitting device having more than two sorts of luminescent materials that absorb and emit light, and to provide a lighting system, backlight for a display and a display using the light emitting device.

Means for Solving the Problem

After keen examination by the inventors of the present invention, they discovered that, in a light emitting device using more than two sorts of luminescent materials, the amount of light emitted from one luminescent material and absorbed in the other luminescent material can be lowered by protecting the light emitted from one luminescent material from entering the area including the other luminescent material, and consequently, the improvement in emission efficiency and color rendering of the light emitting device can be accomplished. And then they could finish the present invention.

Accordingly, a gist of the present invention exists in a light emitting device comprising: at least one light source; at least one first emitting section having at least one sort of luminescent material that emits light including a wavelength component that is longer than that of the light emitted from said light source when excited by the light emitted from said light source; at least one second emitting section having at least one sort of luminescent material that emits light including a wavelength component that is longer than that of the light emitted from said first emitting section when excited by the light emitted from said light source and said first emitting section; and at least one light exit side out of which the light emitted from said light source, said first light-emitting section and said second light-emitting section emerges to the outside; wherein said first emitting section and said second emitting section are opened at said light exit side, and the area of the boundary surface between said first emitting section and said second emitting section is equal to or less than fifty percent of the surface area of said first emitting section (claim 1). With this construction, the amount of light emitted from the first emitting section and absorbed in the second emitting section can be lowered, and therefore, the emission efficiency and color rendering of the light emitting device can be enhanced.

Here, the boundary surface means the surface through which light can come and go between the first emitting section and second emitting section. For example, even if there is a transparent field (as a specific example, a field without first and second luminescent materials) between the first emitting section and the second emitting section, the surface with the smaller area of the two, the first emitting section surface facing the second emitting section and the second emitting section surface facing the first emitting section, is defined as the boundary surface.

As one preferred feature, the area of the boundary surface is equal to or less than fifty percent of the whole area of the light-emerging surface (claim 2). With this construction, the color rendering of the light emitting device can be much more enhanced. Here, the light-emerging surface means the surface on the first emitting section and second emitting section, from which light emerges.

As another preferred feature, said first emitting section is closer to said light source than said second emitting section (claim 3). In other words, it is preferred that the minimum distance among those between the portions on the light source and the first emitting section is shorter than the minimum distance among those between the portions on the light source and the second emitting section. With this construction, the amount of light emitted from the first emitting section and absorbed in the second emitting section can be further lowered, and therefore, the color rendering of the light emerging from the light emitting device can be further enhanced.

Another gist of the present invention exists in a lighting system, wherein said lighting system uses said light emitting device as mentioned above (claim 4).

Still another gist of the present invention exists in a backlight for a display, wherein said backlight for a display uses said light emitting device as mentioned above (claim 5).

Still another gist of the present invention exists in a display, wherein said display uses said light emitting device as mentioned above (claim 6).

Advantageous Effects of the Invention

According to the present invention, a light emitting device that is superior in both emission efficiency and color rendering can be achieved.

By using the light emitting device of the present invention, a lighting system, a backlight for a display and a display that are superior in both emission efficiency and color rendering can be achieved.

BRIEF DESCRIPTION OF THE DRAWINGS

FIG. 3(*a*) is a sectional view, and FIG. 3(*b*) is a top view of it respectively.

FIG. 4(*a*) is a sectional view, and FIG. 4(*b*) is a top view of it respectively.

FIG. 5(*a*) is a sectional view, and FIG. 5(*b*) is a top view of it respectively.

FIG. 6(*a*) is a sectional view, and FIG. 6(*b*) is a top view of it respectively.

BEST MODE FOR CARRYING OUT THE INVENTION

Figure 1A:
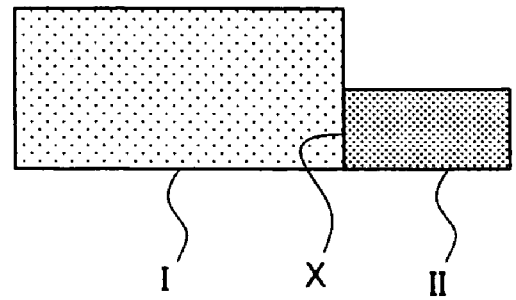
FIGS. 1(*a*)-(*c*) are all schematical and vertical sectional views of first and second emitting sections, for illustrating boundary surfaces.

In the following, the present invention will be described in detail by means of showing examples. The present invention is not restricted to the following examples and the like, but any modification can be made without departing from the scope of the present invention.

[1. Outline of Light Emitting Device]

The light emitting device of the present invention comprises a light source, first emitting section and second emitting section, and is constructed for light to emerge from a light exit side in the direction of emitting light from the first emitting section and the second emitting section (hereinafter, if necessary, called "predetermined direction"). Also, the light emitting device usually comprises a frame as a base for holding the light source, first emitting section and second emitting section.

(1) Frame

The frame is a base for holding the light source, first emitting section and second emitting section. The shape or the material of it can be selected arbitrarily.

Specific examples of the frame shape are plates, cup-like shape or the like. Any appropriate one that is suitable for its purpose of use may be selected. In these examples, cup-like shaped frames are preferred ones, because they can have light-exit directivity, and therefore, the light emerging from the light emitting device can be efficiently utilized.

Specific examples of the frame material are inorganic materials like metals, alloys, glass, carbon or the like, and organic materials like synthetic resins. Any appropriate one that is suitable for its purpose of use may be selected.

At this point, it is preferable that the surfaces of the frame, which are irradiated with lights from the light source, first emitting section and second emitting section, have heightened reflectances with regard to at least some component of the irradiated light. And more preferably, the reflectances are heightened for all the wavelength region of visible light. Thus, it is preferable that at least the surfaces upon which the lights are irradiated are formed from materials with high reflectance. More specifically, for example, either the whole or the surface of the frame may be formed from material (such as, resin used for injection molding) including substances with high reflectance, such as glass fiber, alumina powder, titania powder or the like.

The reflectance of the frame surfaces can be raised in any concrete ways. Besides selecting the material of the frame itself as described above, for example, plating or evaporation coating using metals with high reflectance, such as silver, platinum or aluminum, or alloys can be done so as to enhance the reflectance.

In this regard, the portion with which the reflectance should be raised may be both the whole and a part of the frame. But usually, it is preferred that the reflectance of the entire surface, which is irradiated with the lights from the light source, first emitting section and second emitting section, is raised.

Furthermore, there generally installed on the frame an electrode to supply electric power to the light source.

(2) Light Source

The light source emits exciting light for the luminescent material included in the first emitting section and second emitting section. And it also emits one component of the light emerging from the light emitting device. In other words, a part of the light emitted from the light source is absorbed into the luminescent materials within the first emitting section and second emitting section, as an exciting light, another part of it emerges from the light emitting device in the predetermined direction.

Any kind of light sources can be selected from appropriate ones that are fit for the purpose and construction of the light emitting device. Examples of the light source are light-emitting diodes (hereinafter, if necessary, called "LED"), edge-emitting or surface-emitting type of laser diodes, electroluminescence elements or the like. Usually, LED of low prices are preferably used.

Also, the light source can emit light with any emission wavelength. Thus, any appropriate light source, which has the suitable emission wavelength corresponding to the light that is supposed to emerge from the light emitting device, may be used. For example, in case the light emitting device is set up to emit white light, the emission wavelength of the light emitted from the light source ranges normally equal to or longer than 370 nm, preferably equal to or longer than 380 nm, and normally equal to or shorter than 500 nm, preferably equal to or shorter than 480 nm.

A specific example of the light source is an LED using InGaN-base, GaAlN-base, InGaAlN-base and ZnSeS-base semiconductors crystal-grown on the substrate made of silicon carbide, sapphire, gallium nitride or the like by means of MOCVD method or the like.

The light source may be used not only singularly but also plurally. In addition, more than one kind of light sources, as well as a single sort of it, may be used together.

The light source can be installed to the frame in any concrete ways, as an example, by soldering. Any kinds of solder, such as AuSn, AgSn or the like may be used. In case it is installed by soldering, it can be constructed that electric power can be supplied through the solder from an electrode formed on the frame. Especially when a high power LED or a laser diode, in which the heat release is important, is used as a light source, as soldering is superior in the heat release, it is very effective to install the light source by soldering.

In order to install the light source to the frame in the way other than the soldering, adhesives like epoxy resin, imide resin, acrylic resin or the like can be used, for example. In this case, by using paste-form substance with electrically conducting fillers such as silver particles or carbon particles mixed in an adhesive, the light source can be supplied with electric power by energizing the adhesive, just as the case of using a solder. These electrically conducting fillers are preferably used in combination, because it enhance the heat release.

The light source may be supplied with electric power in any ways, for example, by energizing the solder or the adhesive as mentioned above, as well as by connecting the light source and the electrode by means of wire bonding. There is no limitation to the wire to be used, of which material or size may be decided arbitrarily. Examples of the wire material are metals like gold, aluminum and so on. The diameter of it may be usually 20 µm to 40 µm. But the wire is not restricted to these examples.

Another example of the way to supply electric power to the light source is flip-chip mounting using a bump.

(3) First Emitting Section and Second Emitting Section

The first emitting section is constructed to include at least one sort of luminescent material that emits light including a wavelength component that is longer than that of the light emitted from the light source when excited by the light emitted from the light source. There is no specific limitation to the shape of the first emitting section. It may be provided singularly at one place, as well as provided plurally at more than one places. With respect to the luminescent material used in the first emitting section, particular descriptions will be made later.

The first emitting section receives the light emitted from the light source, which serves as the exciting light for the luminescent material to make it emit light. A part of the light emitted will emerge to the outside of the light emitting device, as one component of the light emerging from the light emitting device. The other part of it will be the exciting light for the luminescent material within the second emitting section.

On the other hand, the second emitting section is constructed to include at least one sort of luminescent material that emits light including a wavelength component that is longer than that of the light emitted from the first emitting section when excited by the light emitted from the light source and the first emitting section. There is no specific limitation to the shape of the second emitting section, either. It may be provided singularly at one place, as well as provided plurally at more than one places. With respect to the luminescent material used in the second emitting section, particular descriptions will be made later, too.

The second emitting section receives the light emitted from the light source and the first emitting section, which serves as the exciting light for the luminescent material to make it emit light. The emitted light will emerge to the outside of the light emitting device as one component of the light emerging from the light emitting device.

Furthermore, the above-mentioned first emitting section and second emitting section are opened at light exit side. Here, the light exit side means the surface out of which the light emerges from the light emitting device in the predetermined direction. Accordingly, the light emitted from the light source, first emitting section and second emitting section emerges from this light exit side in the predetermined direction. The shape of the light exit side can be selected arbitrarily, thus the appropriate one fit for its purpose of use, such as a flat surface, curved surface, corrugated surface or the like, may be preferably selected. It is usually constructed in a manner that, even if the light emerging from the light emitting device emerges in plural directions or emerges radically at the predetermined angular range, the most intensified light emerges in the predetermined direction.

The phrase that the first emitting section and second emitting section are opened means that the light can emerge from the first and second emitting section in the predetermined direction without being blocked by other members. More specifically, it represents that (in case the light emitting device comprises a frame,) the light emerging from the first emitting section in the predetermined direction can emerge to the outside of the light emitting device without being blocked by the light source, second emitting section or frame, and also represents that (in case the light emitting device comprises a frame,) the light emerging from the second emitting section in the predetermined direction can emerge to the outside of the light emitting device without being blocked by the light source, first emitting section or frame. Even when the light emerging from the first and second emitting section emerges to the outside of the light emitting device through some other members, for example a protection layer formed on the light exit side or a cover attached to the light emitting device, the first and second emitting section are defined to be opened when the light can pass through the other members like the protecting layer or cover.

As mentioned earlier, though most of the light emitted from the first emitting section emerges to the outside of the light emitting device, a part of it is emitted to the second emitting section. At that time, the luminescent material of the second emitting section absorbs the light from the first emitting section as an exciting light. This means there occurs the consumption of the light emitted from the first emitting section by the second emitting section. Thus, conventionally, the luminous flux of the light emerging from the light emitting device decreases and therefore the emission efficiency being lowered, owing to the fact that the intensity of the light from the first emitting section, which should basically emerge to the outside from the light emitting device, gets lowered. In addition, optical components of the light emerging from the light emitting device are fluctuated, which makes the color reproduction of the light emitting device get lowered, by the fact that the light emitted from the first emitting section is consumed at the second emitting section.

Moreover, in the conventional construction like Patent Document 1, when we try to adjust the color of the light emerging from the light emitting device to be a desired one, the ratio of the luminescent material in the first emitting section against the luminescent material in the second emitting section has to be adjusted large, so as to compensate the light emitted from the first emitting section and absorbed in the second emitting section. However, the color rendering of the light emerging from the light emitting device depends on the types and the usage ratios among those types, of the luminescent materials. That is why the color rendering of the light has been liable to get insufficient, because the usage ratio of the luminescent materials tends to drop out of the optimal value very far in the conventional construction of the light emitting device like Patent Document 1. In addition, if subsidence of the luminescent materials happens in the first emitting section and second emitting section, because the amount of light absorbed into the second emitting section, which is emitted from the first emitting section, will differ depending on the extent of subsidence of the luminescent materials, the light color fluctuates widely and consequently the color rendering has been liable to get insufficient.

However, because the first emitting section and second emitting section are opened at the light exit side, as mentioned above, the extent that the intensity of the light emitted from the first emitting section and the second emitting section drops down, by being absorbed in the other luminescent material or by being blocked by the other members, can be reduced (or extinguished). Consequently, the fluctuation in the optical components of the light emerging from the light emitting device can be reduced, thereby both the emission efficiency and color rendering of the light emitting device to be enhanced. That also makes it possible that light emerges from the light emitting device using light's three primary colors, or blue, red and green light, which leads to the superiority in the color reproduction of the light emitting device of the present invention, by means of selecting the light source, first emitting section and second emitting section appropriately.

In the light emitting device of the present invention, the area of the boundary surface between the first emitting section and the second emitting section is usually equal to or less than fifty percent of the surface area of the first emitting section, preferably equal to or less than thirty percent of it. In case the first emitting section or the second emitting section are provided plurally, the percentage of the total area of the boundary surfaces to the total area of the first emitting section surfaces are set to be within the range of above-mentioned.

Concerning this, it is preferable that usually equal to or more than 50%, more preferably equal to or more than 70%, of the light emitted from the first emitting section are not applied to the second emitting section.

As mentioned earlier, because the luminescent material of the second emitting section absorbs the light from the first emitting section as an exciting light, the light emitted from the first emitting section is consumed at the second emitting section when it enters the second emitting section. Thus, conventionally, owing to the fact that the intensity of the light from the first emitting section, which should basically emerge to the outside from the light emitting device, gets lowered, the emission efficiency of the light emitting device decreases, and also optical components of the light emerging from the light emitting device fluctuate, which makes the color rendering of the light emitting device get lowered. However, by adjusting the area of the boundary surface between the first emitting section and the second emitting section to be within the above-mentioned range, the amount of the light emitted from the first emitting section and absorbed in the second emitting section can be reduced. This results in that the emission efficiency of the light emitting device can be enhanced, and moreover, the fluctuation in the fluctuation of the optical components of the light which emerges from the light emitting device can be reduced, thereby the color rendering of the light emitting device to be raised.

Here, by illustrating schematical and vertical sectional views of the first and second emitting sections in FIG. 1(a) to FIG. 1(c), the boundary surface will be explained particularly. The boundary surface, in this specification, means the surface through which light can come and go between the first emitting section and second emitting section. The boundary surface may be a flat surface or a curved surface. In case the first emitting section and the second emitting section, which exchange light with each other, are located apart, the surface with the smaller area of the two, that is, the first emitting section surface facing the second emitting section and the second emitting section surface facing the first emitting section, is defined as the boundary surface. Further in case light can be exchanged at several portions between the first emitting section and second emitting section, the total area of all boundary surfaces should be set within the above-mentioned range.

Therefore, for example when the first emitting section I and the second emitting section II, having sizes different from each, are contact with each other as shown in FIG. 1(a), more particularly, a part of the right side (in the Figure) surface of the first emitting section I is in contact with the entire surface of the left side (in the Figure) surface of the second emitting section II, the area of the contacting portion is defined as the area of the above-mentioned boundary surface. Thus, in the example shown in FIG. 1(a), the area of the left side (in the Figure) surface of the second emitting section II comes to be the area of the boundary surface X.

Figure 1B:
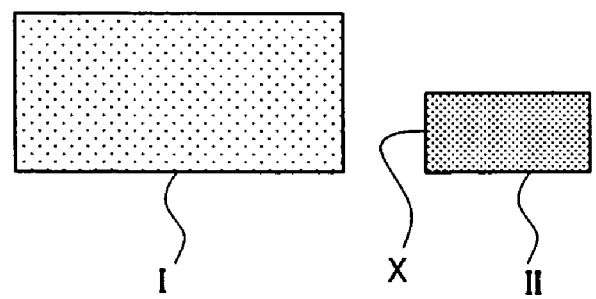

In addition, for example as shown in FIG. 1(b), when the first emitting section I and the second emitting section II are located apart and the surface area of the second emitting section II, which faces the first emitting section I is smaller than the surface area of the first emitting section I, which faces the second emitting section II, the surface area which is smaller of the two, that is, the surface area of the second emitting section II, which faces the first emitting section I, is defined as the boundary surface X's area. In case the first emitting section I and the second emitting section II are located apart and the surface area of the first emitting section I, which faces the second emitting section II is the same as the surface area of the second emitting section II, which faces the first emitting section I, either of them may be treated as the boundary surface.

Figure 1C:
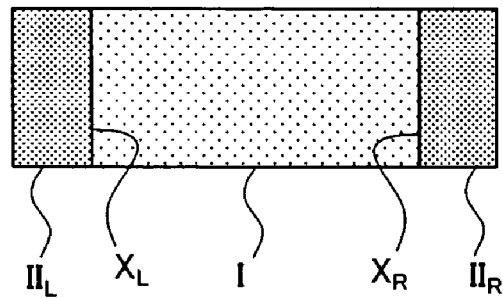

Further, as shown in FIG. 1(c), for example when the second emitting sections $II_R$, $II_L$ are located on both sides of the first emitting section I and light can be exchanged between the first emitting section I and the two second emitting sections $II_R$, $II_L$, located on both sides thereof, the sum of the areas of the boundary surfaces, that is, the sum of the areas of the boundary surface $X_R$ between the first emitting section I and the right (in the Figure) side of the second emitting section $II_R$ and the boundary surface $X_L$ between the first emitting section I and the left (in the Figure) side of the second emitting section $II_R$, should be set to be within the above-mentioned range. Here, FIG. 1(c) shows an example that the side surface areas of the first emitting section I and the side surface areas of the second emitting section $II_R$, $II_L$, being in contact with each other, are the same.

In FIGS. 1(a) to 1(c), substantially the same components are marked with the similar reference letters.

In the light emitting device of the present invention, it is preferred that the area of the boundary surface, as mentioned above, is usually equal to or less than fifty percent of the whole area of the light-emerging surface, more preferably equal to or less than thirty percent of it. Here, the light-emerging surface means the surface of the light emitting device, through which the light from the first emitting section and second emitting section emerges to the outside of the light emitting device. But it is different from the light exit side in the point that the direction in which light emerges is not limited to the predetermined direction. Thereby, the emission spectra inherent in the first emitting section and the second emitting section can be maintained and thus the emission efficiency and color rendering of the light emitting device can be much more enhanced.

Next, by illustrating schematical perspective views of the first and second emitting sections and the frame using FIG. 2(a) to FIG. 2(c), the light-emerging surface will be explained particularly. The light-emerging surface, in this specification, means the outermost surface of the first emitting section and second emitting section, from which the light emerges to the outside of the light emitting device (not necessary in the predetermined direction) without being blocked by any shielding, like a frame.

Figure 2A:
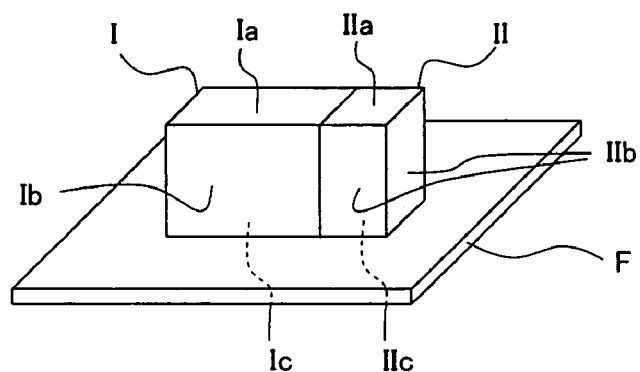
FIGS. 2(*a*)-(*c*) are all schematical and perspective views of first and second emitting sections, as well as of a frame, for illustrating light-emerging surface.

Therefore, as shown in FIG. 2(a) for example, in case quadrangular-prism-shaped first emitting section I and second emitting section II, with which lateral sides have the same area and are in contact with each other, are placed on a plate-shaped opaque frame F, the upper sides of the quadrangular prisms formed by the first emitting section I and the second emitting section II (that is, the upper side Ia of the first emitting section I and the upper side IIa of the second emitting section II) and the lateral sides (that is, the lateral sides Ib of the first emitting section I and the lateral sides IIb of the second emitting section II, except for the lateral surfaces of them contacting together) form the light-emerging surface. At this point, because the light emitted from the lower side of the above-mentioned quadrangular prism (that is, the lower side Ic of the first emitting section I and the lower side IIc of the second emitting section II) will be blocked by the frame F and will not emerge to the outside of the light emitting device, the lower sides Ic, IIc of the quadrangular prisms are not the light-emerging surface.

Figure 2B:
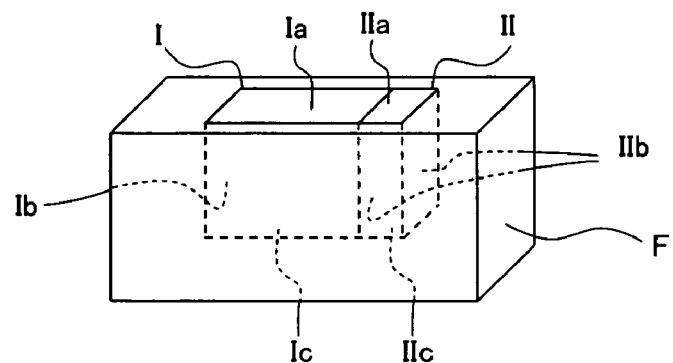

For another example as shown in FIG. 2(b), in case quadrangular-prism-shaped first emitting section I and second emitting section II, similar to those in FIG. 2(a), are provided being surrounded by the frame F, only with their upper sides exposed, the upper sides Ia, IIa of the quadrangular prism that are exposed from the frame F form the light-emerging surface. At this point, the light emitted from the lateral sides Ib, IIb and the lower sides Ic, IIc of the above-mentioned quadrangular prism will be blocked by the frame F and will not emerge to the outside of the light emitting device. Thereby, the lateral sides Ib, IIb and the lower sides Ic, IIc of the quadrangular prisms are not the light-emerging surfaces.

Figure 2C:
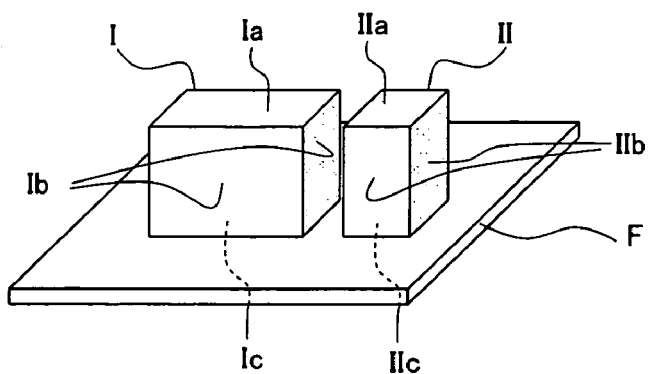

For further example as shown in FIG. 2(c), in case a quadrangular-prism-shaped first emitting section I and second emitting section II, similar to those in FIG. 2(a) are provided being apart from each on a plate-shaped opaque frame F, the upper side Ia and all of the lateral sides Ib of the first emitting section I and the upper side IIa and all of the lateral sides IIb of the second emitting section II will form the light-emerging surface. At this point, the light emitted from the lower side Ic of the first emitting section I and the lower side IIc of the second emitting section II will be blocked by the frame F and will not emerge to the outside of the light emitting device, thereby, the lower side Ic of the first emitting section I and the lower side IIc of the second emitting section II are not the light-emerging surface.

But, even when some other members are formed on the surfaces of the first and second emitting section I, II, as far as the members are made from transparent resin, glass or the like and the light emitted from the first and second emitting section I, II can emerge to the outside of the light emitting device, the surfaces with the other members are the light-emerging surfaces.

In FIGS. 2(a) to 2(c), substantially the same components are marked with the similar reference letters.

Furthermore, in the light emitting device of the present invention, it is preferable that the first emitting section is closer to the light source than the second emitting section is. In other words, it is preferable that the minimum distance among those between the portions on the light source and the first emitting section is shorter than the minimum distance among those between the portions on the light source and the second emitting section.

Hypothetically speaking, in case the light emitted from the light source enters the second emitting section first, it is used as an exciting light and makes the second emitting section emit light. However, as the light from the second emitting section cannot be used as an exciting light in the first emitting section, the intensity of the light emitted from the first emitting section may be lower, or the light from the second emitting section may be too much strong. That possibly results in that the optical components in the light emerging from the light emitting device fluctuate from the intended value, and the color rendering decreases. But by locating the first emitting section closer to the light source than the second emitting section, the light emitted from the light source enters the first emitting section in the first place. Thereby, the first emitting section emits light using the light from the light source as an exciting light and then the second emitting section emits light excited by the light from the first emitting section, which leads to the smoothness with which the first and the second emitting section emit light. Consequently, the fluctuation in the color of the light emerging from the light emitting device can be reduced, thus the color rendering can be much more enhanced.

Though the first emitting section is provided closer to the light source than the second emitting section is, there are the other factors to decide the intensity with which the light emitted from the light source and entering the first emitting section and second emitting section. One of that is the areas of the surfaces where the first emitting section and second emitting section receive light respectively. Thus, the distances from the light source to the first emitting section and to the second emitting section, as well as the area of each light-receiving surfaces are preferably set up in a manner that the intensity of the light received at the first emitting section is higher than that of the light received at the second emitting section.

As far as some kind of exciting light (mainly, the light from the light source) can be applied to the first emitting section and the second emitting section, and as far as the light emitted from the light source, first emitting section and second emitting section can emerge to the outside of the light emitting device, the position, the dimensions, the shape or the like of members forming the light emitting device may be selected arbitrarily.

For example, the first emitting section, second emitting section, light source and frame can be positioned being apart from each, or having apertures between each. As a specific example, there may be provided an aperture between the first emitting section and the second emitting section {refer to FIG. 1(b) and FIG. 2(c)}. As another example, there may be provided an aperture between both or either of the first and second emitting section and the light source {refer to FIG. 6(a)}.

Further, in case some distances are put between the first emitting section and second emitting section, or between either or both of the first emitting section and second emitting section and the light source, for them not to touch with each, some other members may be provided between them. At this point, it is preferable to use desired-light-permeable materials, such as glass or resins like epoxy resin or silicone resin, for the other members, because they can increase the luminous flux. As an specific example, with a cover layer of transparent resin provided on the all circumferences of the light source, although there provide gaps between the light source and the first emitting section or the second emitting section, light from the light source can be applied to the first emitting section and second emitting section surely as an exciting light, in a state where the luminous flux is being kept to be high. This makes it possible to protect the light source, without lowering the intensity of the light emerging from the light emitting device.

In addition, the sizes of the first emitting section and the second emitting section may differ, as mentioned above.

Also, the light emitting device of the present invention may comprise members other than the above-mentioned light source, first emitting section, second emitting section and frame.

For example, it may comprise a cover for protecting the light emitting device itself.

For another example, it may comprise a light guide member, such as a mirror, prism, lens, optical fiber or the like, for changing the direction in which light emerge form the light emitting device.

It may also comprise a radiator plate for releasing heat generated in the light emitting device.

It may further comprise, for example, a light diffusion layer or the like at the light exit side of the light emitting device, for diffusing each component of the light emerging from the light emitting device so as to prevent the color irregularity of the light percepted visually.

[2. Composition of Light Emitting Sections]

There is no selection restriction to luminescent materials used for the light emitting device of the present invention, as far as they can absorb exciting light and emit light including a wavelength component that is longer than that of the absorbed exciting light. And in case we form the first emitting section and second emitting section using luminescent materials, usually the luminescent materials are used being mixed with at least one binder.

(1) Luminescent Material

Any known luminescent materials can be selected to be used appropriately, corresponding to the purpose of the light emitting device. Light emission itself can be made through any mechanisms, such as fluorescence, phosphorescence or the like. In the first emitting section and second emitting section respectively, single sort of luminescent material can be used, as well as more than one sort of them can be used together with any combinations of sorts and mixture ratios. In this regard, the luminescent material that can be excited by the light emitted from the light source and can emit light having wavelength components longer than that of the light from the light source should be selected for the first emitting section, and the luminescent material that can be excited by the light emitted from the light source and the first emitting section and can emit light having wavelength components longer than that of the light from the first emitting section should be selected for the second emitting section.

It is preferred that the luminescent material absorbs the exciting light having the wavelength of usually equal to or longer than 350 nm, preferably equal to or longer than 400 nm, more preferably equal to or longer than 430 nm, and usually equal to or shorter than 600 nm, preferably equal to or shorter than 570 nm, more preferably equal to or shorter than 550 nm.

And it is preferred that the wavelength of the light emitted from the luminescent material is usually equal to or longer than 400 nm, preferably equal to or longer than 450 nm, more preferably equal to or longer than 500 nm, and usually equal to or shorter than 750 nm, preferably equal to or shorter than 700 nm, more preferably equal to or shorter than 670 nm.

With respect to the luminescent material used for the first emitting section, it is preferred that it absorbs the exciting light having the wavelength of usually equal to or longer than 350 nm, preferably equal to or longer than 400 nm, more preferably equal to or longer than 430 nm, and usually equal to or shorter than 520 nm, preferably equal to or shorter than 500 nm, more preferably equal to or shorter than 480 nm.

And it is preferred that the wavelength of the light emitted from the luminescent material used for the first emitting section is usually equal to or longer than 400 nm, preferably equal to or longer than 450 nm, more preferably equal to or longer than 500 nm, and usually equal to or shorter than 600 nm, preferably equal to or shorter than 570 nm, more preferably equal to or shorter than 550 nm.

With respect to the luminescent material used for the second emitting section, it is preferred that it absorbs the exciting light having the wavelength of usually equal to or longer than 400 nm, preferably equal to or longer than 450 nm, more preferably equal to or longer than 500 nm, and usually equal to or shorter than 600 nm, preferably equal to or shorter than 570 nm, more preferably equal to or shorter than 550 nm.

And it is preferred that the wavelength of the light emitted from the luminescent material used for the second emitting section is usually equal to or longer than 550 nm, preferably equal to or longer than 580 nm, more preferably equal to or longer than 600 nm, and usually equal to or shorter than 750 nm, preferably equal to or shorter than 700 nm, more preferably equal to or shorter than 670 nm.

Further, it is preferred that the luminous efficiency of the luminescent material is usually equal to or more than 40%, preferably equal to or more than 45%, more preferably equal to or more than 50%, much more preferably equal to or more than 55%, most preferably equal to or more than 60%. The luminous efficiency shown here is the value represented as the product of the quantum absorption efficiency and internal quantum efficiency.

In the following, luminescent materials preferably used for the light emitting device of the present invention will be explained, by exemplifying those suitable for each emitting section. However, the luminescent materials are not limited to the following examples. In addition, we can make arbitral selection about which of following examples of the luminescent materials should be used for the first emitting section and the second emitting section respectively, within the scope of the present invention.

(Examples Suitable for Luminescent Material of First Emitting Section)

(First Example of First Emitting Section)

The first example of the luminescent material suitable for the first emitting section is a phosphor represented by the following formula (1).

$$M^1_a M^2_b M^3_c O_d \quad \text{Formula (1)}$$

In the above Formula (1), $M^1$ shows a divalent metallic element, $M^2$ shows a trivalent metallic element and $M^3$ shows a tetravalent metallic element respectively. The letters a, b, c and d are the number within the following ranges respectively.

$2.7 \leq a \leq 3.3$
$1.8 \leq b \leq 2.2$
$2.7 \leq c \leq 3.3$
$11.0 \leq d \leq 13.0$ $M^1$ in the above formula (1), which is a divalent metallic element, is preferably at least one type selected from the group consisting of Mg, Ca, Zn, Sr, Cd and Ba, more preferably it is Mg, Ca or Zn, and the most preferably it is Ca, from the aspect of luminous efficiency or the like. At this point, Ca may be of a single system, as well as of a complex system with Mg. Basically, it is preferred that $M^1$ consists of the above preferable elements, but at least one divalent metallic element can be included as far as they do not hinder its function.

$M^2$ in the above formula (1), which is a trivalent metallic element, is preferably at least one type selected from the group consisting of Al, Sc, Ga, Y, In, La, Gd and Lu, more preferably it is Al, Sc, Y or Lu, and the most preferably it is Sc, from the similar aspect to $M^1$. At this point, Sc may be of a single system, as well as of a complex system with Y or Lu. Basically, it is preferred that $M^2$ consists of the above preferable elements, but at least one trivalent metallic element can be included as far as they do not hinder its function.

$M^3$ in the above formula (1), which is a tetravalent metallic element, preferably include at least Si, from the similar aspect to $M^1$ and $M^2$. Moreover, usually equal to or more than 50 mole %, preferably equal to or more than 70 mole %, more preferably equal to or more than 80 mole % and the most preferably equal to or more than 90 mole % of the tetravalent metallic element represented by $M^3$ is preferred to be Si.

In the above formula (1), a specific example of tetravalent metallic element $M^3$, other than Si, is preferably one type selected from the group consisting of Ti, Ge, Zr, Sn and Hf, more preferably it is one type selected from the group consisting of Ti, Zr, Sn and Hf, and the most preferably it is Sn. By far the most preferably, $M^3$ is Si. Basically, it is preferred that $M^3$ consists of the above preferable elements, but at least one tetravalent metallic element can be included as far as they do not hinder its function.

In the present specification, "to include something as far as not hindering the function" means to include it with the ratio of usually equal to or less than 10 mole %, preferably equal to or less than 5 mole %, more preferably equal to or less than 1 mole % against the amount of above $M^1$, $M^2$ and $M^3$ respectively.

The crystal structure of the above-mentioned phosphor is generally a garnet crystal structure, which is a crystal of body centered cubic lattice with the numbers a, b, c and d in the above formula (1) taking the values of 3, 2, 3 and 12 respectively. Pay attention to that the numbers a, b, c and d in the above formula (1) do not always take the values of 3, 2, 3 and 12 respectively, because of the substitution of the luminescent center ion element into the position of the crystal lattice of the metallic element, which is either $M^1$, $M^2$ or $M^3$, or because of the disposition of it into interstice. Accordingly, the values of a, b, c and d are preferred to be within the range of $2.7 \leq a \leq 3.3$, $1.8 \leq b \leq 2.2$, $2.7 \leq c \leq 3.3$ and $11.0 \leq d \leq 13.0$ respectively.

This luminescent center ion, contained in the host material of the crystal structure, contains at least Ce, and may possibly include one or more than one type of divalent to tetravalent elements selected from the group consisting of Cr, Mn, Fe, Co, Ni, Cu, Pr, Nd, Sm, Eu, Tb, Dy, Ho, Er, Tm and Yb, for the purpose of fine adjustment of the emission property. It is particularly preferred to include one or more than one type of divalent to tetravalent elements selected from the group consisting of Mn, Fe, Co, Ni, Cu, Sm, Eu, Tb, Dy and Yb. And among them, it is more particularly preferred to use divalent Mn, divalent or trivalent Eu and trivalent Tb.

This phosphor is usually excited by the light with wavelength of 420 nm to 480 nm. The emission spectrum of it has a peak at 500 to 510 nm, and contains wavelength components of 450 to 650 nm.

(Second Example of First Emitting Section)

The second example of the luminescent material suitable for the first emitting section is a phosphor represented by the following formula (2).

$$M^1_a M^2_b M^3_c O_d \quad \text{Formula (2)}$$

In the above Formula (2), $M^1$ shows an activator agent element including at least Ce, $M^2$ shows a divalent metallic element and $M^3$ shows a trivalent metallic element respectively. The letters a, b, c and d are the number within the following ranges respectively.

$0.0001 \leq a \leq 0.2$
$0.8 \leq b \leq 1.2$
$1.6 \leq c \leq 2.4$
$3.2 \leq d \leq 4.8$ $M^1$ in the above Formula (2) is an activator agent element contained within the after-mentioned host crystal and it includes at least Ce. For the purpose of long lasting photoluminescence, chromaticity adjustment or sensitization, it can include at least one type of divalent to tetravalent elements selected from the group consisting of Cr, Mn, Fe, Co, Ni, Cu, Ce, Pr, Nd, Sm, Eu, Tb, Dy, Ho, Er, Tm and Yb.

In the above Formula (2), the value a representing the content of activator agent element $M^1$ is in the range of $0.0001 \leq a \leq 0.2$. In case the value a is too small, the amount of the luminescent center ion existing in the host crystal of the phosphor gets too small and thus the emission intensity tends to decrease. On the other hand, in case the value a is too large, the emission intensity tends to decrease by concentration quenching. Therefore, in the viewpoint of the emission intensity, a is preferred to be preferably equal to or more than 0.0005, more preferably equal to or more than 0.002, and preferably equal to or less than 0.1, more preferably equal to or less than 0.04. In addition, the peak wavelength of the emission is shifted toward long-wavelength side and the emission amount of green light, which is high in visual sensitivity, gets relatively large, accompanied with the increase in the content of Ce. Therefore, in the aspect of the balance between the emission intensity and emission peak wavelength, the value of a is preferred to be usually equal to or more than 0.004, preferably equal to or more than 0.008, more preferably equal to or more than 0.02, and usually equal to or less than 0.15, preferably equal to or less than 0.1, more preferably equal to or less than 0.08.

$M^2$ in the above formula (2), which is a divalent metallic element, is preferably at least one type selected from the group consisting of Mg, Ca, Zn, Sr, Cd and Ba, more preferably it is Mg, Ca or Sr, from the aspect of luminous efficiency or the like. It is also particularly preferred that equal to or more than 50 mole % of elements contained in $M^2$ are Ca.

$M^3$ in the above formula (2), which is a trivalent metallic element, is preferably at least one type selected from the group consisting of Al, Sc, Ga, Y, In, La, Gd, Yb and Lu, more preferably it is Al, Sc, Yb or Lu, and the most preferably it is Sc, Sc with Al, or Sc with Lu, from the similar aspect to $M^2$. It is also particularly preferred that equal to or more than 50 mole % of elements contained in $M^3$ are Sc.

The host crystal of the phosphor is generally the crystal consisting of divalent metallic element of $M^2$, trivalent metallic element of $M^3$ and oxygen, represented by the composition formula of $M^2M^3{}_2O_4$. Thus, elemental ratio of the chemical composition is that b, c and d in the above formula (2) are 1, 2 and 4 respectively. Pay attention to that the numbers b, c and d in the above formula (2) do not always take the values of 1, 2 and 4 respectively, because of the substitution of the activator element Ce into the position of the crystal lattice of the metallic element, which is either $M^2$ or $M^3$, or because of the disposition of it into interstice.

Accordingly, in the above formula (2), the value of b is preferred to be usually equal to or more than 0.8, preferably equal to or more than 0.9, and usually equal to or less than 1.2, preferably equal to or less than 1.1. The value of c is preferred to be usually equal to or more than 1.6, preferably equal to or more than 1.8, and usually equal to or less than 2.4, preferably equal to or less than 2.2. The value of d is preferred to be usually equal to or more than 3.2, preferably equal to or more than 3.6, and usually equal to or less than 4.8, preferably equal to or less than 4.4.

In the above formula (2), $M^2$ and $M^3$, which represent divalent and trivalent metallic elements respectively, just a small part of $M^2$ and/or $M^3$ may be monovarent, tetravalent or pentavarent metallic element so as to adjust the balance of the electric charge or the like, as far as their emission properties or crystal structures would not differ intrinsically. Furthermore, just a small amount of anion, for example halogens (F, Cl, Br, I), nitrogen, sulfur, selenium or the like may be contained in the compound.

This phosphor is usually excited by the light with wavelength of 420 nm to 480 nm. Particularly, it is excited most efficiently by the light of 440 to 470 nm. The emission spectrum thereof has a peak at 490 to 550 nm, and contains wavelength components of 450 to 700 nm.

(Other Examples of First Emitting Section)

Other examples of luminescent material suitably used in the first emitting section are materials with the emission peak wavelength around 400 nm to 500 nm such as $(Ba,Ca,Sr)MgAl_{10}O_{17}:Eu$, $(Ba,Mg,Ca,Sr)_5(PO_4)_4Cl:Eu$, $(Ba,Ca,Sr)_3MgSi_2O_8:Eu$ and the like, or materials with the emission peak wavelength around 500 nm to 600 nm such as $(Ba,Ca,Sr)MgAl_{11}O_{17}:Eu,Mn$, $(Ba,Ca,Sr)Al_2O_4:Eu$, $(Ba,Ca,Sr) Al_2O_4:Eu,Mn$, $(Ca,Sr)Al_2O_4:Eu$, Eu-activated α-sialon represented by the general formula of $Ca_xSi_{12-(m+n)}Al_{(m+n)}O_nN_{16-n}:Eu$ (here, $0.3<x<1.5$, $0.6<m<3$, $0 \leq n<1.5$) and the like. However, it is not restricted to these examples, and more than one of these examples may be used together.

(Examples Suitable for Luminescent Material of Second Emitting Section)

(First Example of Second Emitting Section)

The first example of the luminescent material suitable for the second emitting section is a phosphor represented by the following formula (3).

$$M_aA_bD_cE_dX_e \quad \text{Formula (3)}$$

In the above formula (3), the letter M shows one or more types of elements selected from the group consisting of Mn, Ce, Pr, Nd, Sm, Eu, Tb, Dy, Ho, Er, Tm and Yb, including at least Eu. The letter A shows one or more types of elements selected from the group consisting of divalent metallic elements other than the element M. The letter D shows one or more types of elements selected from the group consisting of tetravalent metallic elements. The letter E shows one or more types of elements selected from the group consisting of trivalent metallic elements. The letter X shows one or more types of elements selected from the group consisting of O, N and F.

The letters a, b, c, d and e are the numbers within the following ranges respectively.

$0.00001 \leq a \leq 0.1$ $a+b=1$ $0.5 \leq c \leq 4$ $0.5 \leq d \leq 8$ $0.8 \times (2/3+4/3 \times c+d) \leq e$ $e \leq 1.2 \times (2/3+4/3 \times c+d)$ In the above formula (3), though M is one or more types of elements selected from the group consisting of Mn, Ce, Pr, Nd, Sm, Eu, Tb, Dy, Ho, Er, Tm and Yb, including at least Eu, it is preferred to be one or more types of elements selected from the group consisting of Mn, Ce, Sm, Eu, Tb, Dy, Er and Yb. And it is more preferred to be Eu.

Also in the above formula (3), A is one or more types of elements selected from the group consisting of divalent metallic elements other than the element M, and it is particularly preferred to be one or more types of elements selected from the group consisting of Mg, Ca, Sr, and Ba. And it is more preferred to be Ca.

Also in the above formula (3), D is one or more types of elements selected from the group consisting of tetravalent metallic elements, and it is particularly preferred to be one or more types of elements selected from the group consisting of Si, Ge, Sn, Ti, Zr and Hf. And it is more preferred to be Si.

Also in the above formula (3), E is one or more types of elements selected from the group consisting of trivalent metallic elements, and it is particularly preferred to be one or more types of elements selected from the group consisting of B, Al, Ga, In, Sc, Y, La, Gd and Lu. And it is more preferred to be Al.

Also in the above formula (3), X is one or more types of elements selected from the group consisting of O, N and F, and it is particularly preferred to be N, or N with O.

In the above formula (3), the letter a shows the contained amount of the element M, the luminescent center. It is preferred that a, which is the number ratio of atoms of M and (M+A) in the phosphor {that is, a=(M atom number)/(M atom+A atom number)}, takes the value from 0.00001 to 0.1. When the value of a is smaller than 0.00001, the number of M, which serves as the luminescent center, is too small and thereby there is the possibility of decrease in emission brightness. When the value of a is larger than 0.1, the interference between ions of M causes the concentration quenching and thereby there is the possibility of decrease in brightness. Especially when the element M is Eu, the value of a is preferably within 0.002 to 0.03, as it can have high emission brightness then.

Further in the above formula (3), the letter c shows the contained amount of the element D, for example Si, the value of which is within the range of $0.5 \leq c \leq 4$, preferably $0.5 \leq c \leq 1.8$, more preferably c is equal to 1. When the value of c is smaller than 0.5 or larger than 4, there is the possibility of decrease in emission brightness. When c is within the range of $0.5 \leq c \leq 1.8$, the emission brightness goes up, and especially when c is equal to 1, the emission brightness is particularly high.

Further in the above formula (3), the letter d shows the contained amount of the element E, for example Al, the value of which is within the range of $0.5 \leq d \leq 8$, preferably $0.5 \leq d \leq 1.8$, more preferably d is equal to 1. When the value of d is smaller than 0.5 or larger than 8, there is the possibility of decrease in emission brightness. When d is within the range of $0.5 \leq d \leq 1.8$, the emission brightness goes up, and especially when d is equal to 1, the emission brightness is particularly high.

Further in the above formula (3), the letter e shows the contained amount of the element X, for example N, the value of which is within the range of equal to or more than $0.8 \times (2/3+4/3 \times c+d)$ and equal to or less than $1.2 \times (2/3+4/3 \times c+d)$. More preferably, e is equal to 3. When the value of e is out of the above-cited range, there is the possibility of decrease in emission brightness.

Among the above-cited examples of composition, the desirable composition with high emission brightness, is that, at least, M element includes Eu, A element includes Ca, D element includes Si, E element includes Al, and X element includes N. It is especially preferred that it is an inorganic compound in which M element is Eu, A element is Ca, D element is Si, E element is Al, and X element is N or N and O mixture.

This phosphor is excited by the light with wavelength of at least equal to or shorter than 580 nm. Particularly, it is excited most efficiently by the light of 400 nm to 550 nm, thereby it can also absorb the light emitted from the first emitting section efficiently. The emission spectrum thereof has a peak at 580 to 720 nm.

(Second Example of Second Emitting Section)

The second example of the luminescent material suitable for the second emitting section is a phosphor represented by the following formula (4).

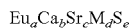  Formula (4)

In the above Formula (4), M shows at least one type of element selected from Ba, Mg and Zn. The letters a, b, c, d and e are the numbers within the following ranges respectively.

$0.0002 \leq a \leq 0.02$
$0.3 \leq b \leq 0.9998$
$0 \leq d \leq 0.1$
$a+b+c+d=1$
$0.9 \leq e \leq 1.1$ In the aspect of stability to heat, the value of a in the above-cited formula (4) is preferably within the range of usually equal to or more than 0.0002, more preferably equal to or more than 0.0004, and usually equal to or less than 0.02.

In the aspect of temperature characteristic, the value of a in the above-cited formula (4) is preferably within the range of usually equal to or more than 0.0004 and equal to or less than 0.01, preferably equal to or less than 0.007, more preferably equal to or less than 0.005 and most preferably equal to or less than 0.004.

Further, in the aspect of emission intensity, the value of a in the above-cited formula (4) is preferably within the range of usually equal to or more than 0.0004, preferably equal to or more than 0.001, and usually equal to or less than 0.02, preferably equal to or less than 0.008. In case the contained amount of luminescent center ion Eu falls to below the above-mentioned range, the emission intensity tends to get lower. On the other hand, even in case it overtakes the above-mentioned range, the emission intensity tends to get lower too by a phenomenon called concentration quenching.

The desirable value of a in the above-cited formula (4), which fulfill all aspects of stability to heat, temperature characteristic and emission intensity, is within the range of usually equal to or more than 0.0004, more preferably equal to or more than 0.001, and usually equal to or less than 0.004.

In the fundamental crystal, represented by the aforementioned formula (4), $Eu_aCa_bSr_cM_dS_e$, the mole ratio between cation site occupied with Eu, Ca, Sr or M and anion site occupied with S is 1:1. However, even if there generated cation deficits or anion deficits, there is no profound effect on the present object, the fluorescent characteristic. Therefore, the fundamental crystal of the above formula (4) may be used with the mole ratio e of anion site occupied with S being within the range of 0.9 to 1.1.

In the phosphor of the above-cited formula (4), M, which represents the element of at least one type selected from Ba, Mg and Zn, is not necessary the indispensable one for the present invention. However, even when it is contained in the compound of the aforementioned formula (4) with the mole ratio d of M, which is $0 \leq d \leq 0.1$, the object of the present invention can be achieved.

Moreover, even in case that under the 1% amount of elements, other than Eu, Ca, Sr, Ba, Mg, Zn and S, are included in the compound of the aforementioned formula (4), there is no problem of use.

This phosphor is excited by the light with wavelength of equal to or shorter than 600 nm. Particularly, it is excited most efficiently by the light of 400 nm to 550 nm, thereby it can also absorb the light emitted from the first emitting section efficiently. The emission spectrum thereof has a peak at 620 to 680 nm.

(Other Examples of Second Emitting Section)

There is no specific limitation to the other examples of luminescent material suitably used in the second emitting section, as far as they have the emission wavelength of 550 nm to 750 nm, which is longer than that of the first emitting section. For example, Eu-activated a-sialon represented by the general formula of $Ca_xSi_{12-(m+n)}Al_{(m+n)}O_nN_{16-n}$:Eu (here, $0.3<x<1.5$, $0.6<m \leq 3$, $0 \leq n \leq 1.5$), $Ca_2Si_5N_8$:Eu, $CaSi_7N_{10}$:Eu, europium complex emitting fluorescence, and the like, can be used. More than one of the above-mentioned phosphors can be used in combination.

In addition, the luminescent material is usually used in a granular state. In this regard, the size of the luminescent material particle is usually equal to or shorter than 150 μm, preferably equal to or shorter than 50 μm, more preferably equal to or shorter than 20 μm, further more preferably equal to or shorter than 10 μm, and most preferably equal to or shorter than 5 μm. In case it exceeds this range, the luminescent color of the light emitting device fluctuates widely, and there is the possibility, if the luminescent material is mixed with sealant, of difficulty in applying the luminescent material uniformly. It is also usually equal to or longer than 0.001 μm, preferably equal to or longer than 0.01 μm, more preferably equal to or longer than 0.1 μm, further more preferably equal to or longer than 1 μm, most preferably equal to or longer than 2 μm. In case it falls below this range, the luminous efficiency gets lowered.

The volume ration of the luminescent material in the second emitting section to that in the first emitting section may be decided arbitrarily. It is usually equal to or more than 0.05, preferably equal to or more than 0.1, more preferably equal to or more than 0.2, and usually equal to or less than 1, preferably equal to or less than 0.8, more preferably equal to or less than 0.5. When the ratio is too big or too small, it is difficult for the desirable white light emission to be obtained.

In case, we form the first emitting section or second emitting section without using binder, for example, we fire the luminescent material to manufacture the burned substance of it, which may be used directly for the first emitting section or second emitting section. We can also manufacture the first emitting section or second emitting section without binders, for example, by forming the luminescent material into glass or using the single crystal of the luminescent material after it is processed. In this regard, even when binder is not used, the other components like additives may be coexisted with the first emitting section or second emitting section.

The second emitting section may also contain the luminescent material of the first emitting section, besides the luminescent material emitting light including a wavelength component longer than that of the light emitted from the first emitting section when excited by the light emitted from the light source and the first emitting section, binder, or the other components. At this point, in order to obtain as great luminous flux as possible, it is preferable that the concentration of the first emitting section luminescent material included in the second emitting section is small and that, more preferably, there is no first emitting section luminescent material contained in the second emitting section.

On the other hand, the first emitting section generally contains no second emitting section luminescent material, it may contain the second emitting section luminescent material to the extent that the luminous flux of the light emitted from the first emitting section is not reduced. In that instance, it is preferred that the volume percent of it is usually equal to or lower than 40, more preferably, there is no second emitting section luminescent material contained. In other words, luminescent materials in each of the emitting sections should be decided so as to protect the second emitting section luminescent material in the first emitting section from absorbing the light emitted from the first emitting section luminescent material within the first emitting section too much, though the luminescent material in the second emitting section may be excited by the light emitted from the first emitting section.

(2) Binder

As mentioned above, the first emitting section and second emitting section may contain binder, besides luminescent material. Binder is used for binding up the luminescent material, which usually in the state of powder or particle, or attaching it to the frame. There is no specific limitation to the binder of the present invention, and any known types of it may be used arbitrarily.

Pay attention to that, if we construct the light emitting device to be as a transmissive-type one, which can make the light, emitted from the light source, first emitting section and second emitting section, emerge to the outside of the light emitting device, it preferred to select the binder of the type which can be penetrated with each component of the light emitted from the light emitting device.

As a binder, inorganic materials like glass, as well as resins, may be used. The specific examples of it are organic synthetic resin like epoxy resin, silicone resin or the like, and inorganic materials like polysiloxane gel, glass or the like.

When we use resins as binder, although the viscosity of the resin may be selected arbitrarily, it is preferred to use the binder with the viscosity fit for the particle size and specific gravity of the luminescent material to be used, especially fit for the specific gravity per unit surface area. For example, when we use epoxy resin as the binder, under the condition that the particle size of the luminescent material is 2 μm to 5 μm and the specific gravity of it is 2 to 5, it is usually preferred to use epoxy resin having the viscosity of 1 to 10 Pas, because it lets the particles of the luminescent material disperse well.

More than one kind of binders may be used together in any combinations and ratios, as well as a single sort of it may be used singularly.

(3) Ratio of Luminescent Material to be Used

In case binder is used for the luminescent material, there is no restriction to the ratio between the luminescent material and the binder. But it is preferred that the weight ratio of the luminescent material to the binder is usually equal to or more than 0.01, preferably equal to or more than 0.05, more preferably equal to or more than 0.1, and usually equal to or less than 5, preferably equal to or less than 1, more preferably equal to or less than 0.5.

But in this regard, when the light emitting device is a transmissive type of one, the luminescent materials are preferred to be dispersed to some extent within the first emitting section and second emitting section, for the purpose of getting higher luminous flux. On the other hand, when the light emitting devices a reflective type of one (where, the light emitted from the light source, first emitting section and second emitting section emerges to the outside of the light emitting device without passing through the first emitting section and second emitting section), the luminescent material is preferred to be filled in the high density, for the purpose of getting higher luminous flux. Therefore, the composition of the luminescent material should be set up according to the purpose of the light emitting device, types and properties of the luminescent materials, types and viscosities of binders or the like, considering the above-mentioned factors.

The luminescent color of the light emerging from the light emitting device can be changed arbitrarily by adjusting the luminescent material ratio in each of the first emitting section and second emitting section, and weight of the luminescent material used. With this construction, intermediate color with chromatic coordinate such as (x=0.47,y=0.42), (x=0.35, y=0.25), (x=0.25,y=0.30) or (x=0.30,y=0.40), as well as a color with chromatic coordinate such as (x=0.333,y=0.333).

(4) Other Components

The first emitting section and second emitting section may be formed, consisting of luminescent material, and if necessary, binder and other components, by adding the other components into the luminescent material.

There is no specific limitation to the other components, and any known additive may be used arbitrarily.

An specific example is that diffusing agent, like alumina or yttria is, is preferably used as an other component, for example when the property of light distribution or the color mixture of the light emitting device should be controlled.

For another example, when the luminescent material is filled in the high density, binding agent such as calcium pylophosphate or barium calcium borate as other components.

(5. Manufacturing Method of Light-Emitting Section)

There is no specific restriction to the manufacturing method of the first emitting section and the second emitting section, and thereby they may be produced by any manufacturing method. Hereinafter, though the manufacturing method of a first emitting section and second emitting section will be described by exemplification, the first emitting section and second emitting section may be produced by methods other than the after-mentioned one.

A first emitting section and second emitting section can be produced, for example, by the following procedure. First, slurry is prepared by dispersing luminescent material, and if necessary, binder and other components in dispersion medium. Then the prepared slurry is applied to a base such as a frame, and the slurry is dried.

The slurry preparation is conducted by mixing luminescent material, and if necessary binder and other components like additive into dispersion medium. Although slurry is sometimes called paste or pellet depending on the type of the binder to be used, they all are called slurry in this specification.

There is no limitation to dispersion medium used in slurry preparation, and thereby any known dispersion medium may be used. The specific examples thereof are; chain hydrocarbons like n-hexane, n-heptane or Solvesso, aromatic hydrocarbon like toluene or xylene, halogenated hydrocarbon like trichloroethylene or perchloroethylene, alcohols like methanol, ethanol, isopropanol or n-butanol, ketones like acetone, methyl ethyl ketone or methyl isobutyl ketone, esters like ethyl acetate or n-butyl acetate, ethers like cellosolve, butylsolve or cellosolve acetate, water-based solvent like water or various water solution, and the like.

Next, the prepared slurry is applied on a base such as a frame. Any method of applying, for example, dispensing, potting or the like, can be used.

In case slurry is applied on the frame directly, slurries to be a first emitting section and a second emitting section may be applied in any order. That is, either of them can be applied first. Also they can be applied at the same time.

After the application, the dispersion medium is evaporated by drying and the first emitting section and second emitting section are formed. Any method of drying, for example, drying naturally, drying by heating, drying in a vacuum, baking, UV curing, electron irradiation or the like, can be used.

Among all drying methods, baking at the temperature of several tens to one hundred and several tens ° C. is preferred, because the dispersion medium can be removed easily and surely with an inexpensive facility in the method.

As mentioned earlier, in case the luminescent material should be highly densified for the purpose of manufacturing a reflective type of light emitting device, binding agent, as an other component, is preferably mixed in the slurry. On applying the slurry mixed with binding agent, application methods like screen printing or ink jet printing may be preferably used, because it is easy to differentiate the areas of the first emitting section and second emitting section with the methods. Of course, even in case using binding agent, the ordinary way of applying may be used.

There are other methods of manufacturing a first emitting section and second emitting section without using slurry. For example, the first emitting section and second emitting section can be manufactured by mixing luminescent material and, if necessary, binder and other components, and then, molded them by kneading. For the process of molding, for example, press molding, extrusion molding (T-Die extrusion, inflation extrusion, blow molding, melt spinning, profile extrusion or the like), injection molding or the like can be used.

In case binder is thermosetting, for example when it is epoxy resin, silicone resin or the like, the first emitting section and second emitting section can be manufactured by mixing binder, not yet cured, luminescent material, and if necessary, other components and then molding them and heating to cure the binder. In case binder is UV curable, the first emitting section and second emitting section can be manufactured by means of UV curing, instead of heating in the above-mentioned process, to cure binder resin.

By the way, the first emitting section and second emitting section may be formed during the successive sequence of manufacturing the light emitting device, or otherwise, the light emitting device can be finished by incorporating the first emitting section and second emitting section, prepared in advance, into a frame or the like. Further alternatively, it is possible that, after preparing a unit consisting of a frame and either the first emitting section or the second emitting section, the light emitting device is finished by combining this unit.

4. EMBODIMENTS

In the following, embodiments of the present invention will be described. The present invention is not restricted to the following embodiments, but any modification can be made without departing from the scope of the present invention.

(1) First Embodiment

Figure 3A:
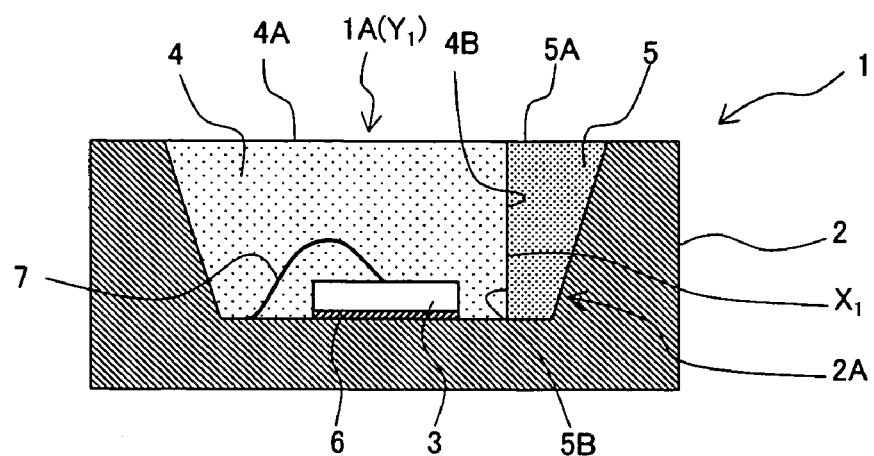
FIG. 3(*a*) and FIG. 3(*b*) are figures illustrating schematically the main part of the light emitting device, as a first embodiment of the present invention.
Figure 3B:
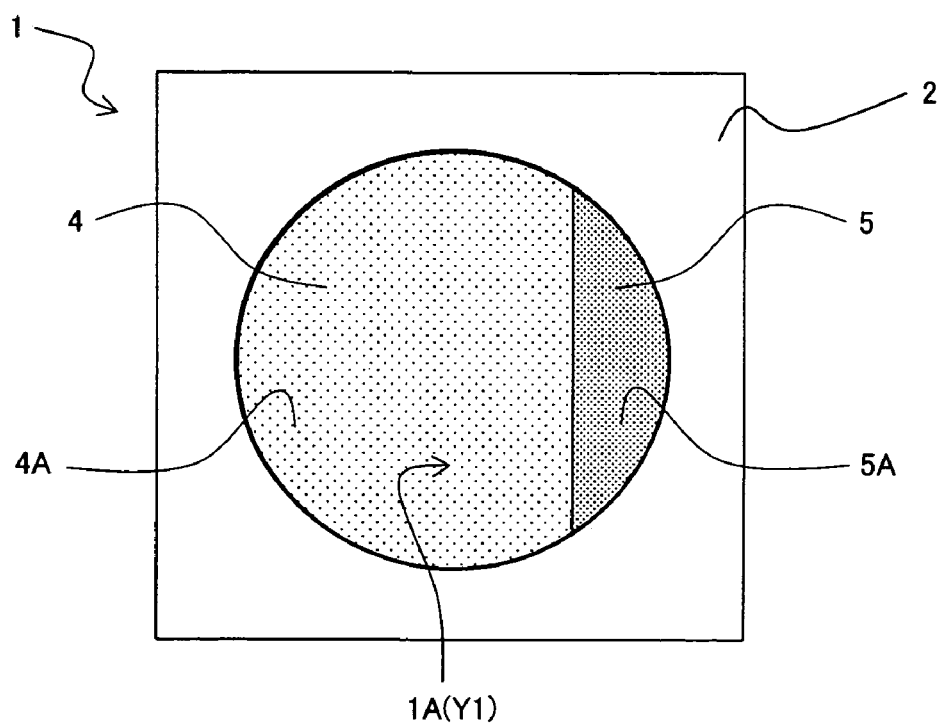

FIG. 3(a) and FIG. 3(b) are figures illustrating schematically the main part of the light emitting device, as a first embodiment of the present invention. FIG. 3(a) is a sectional view, and FIG. 3(b) is a top view of it respectively.

As shown in FIG. 3(a) and FIG. 3(b), the light emitting device 1 of the present embodiment comprises a frame 2, a light source or a blue LED (blue emitting section) 3, a first emitting section or a green emitting section 4 and a second emitting section or a red emitting section 5.

The frame 2 is a base, made from resin, for holding the blue LED 3, green emitting section 4 and red emitting section 5. On the upper side of the frame 2, a depressed portion (a recession) 2A opening upward, in Figs., with a cross-sectional shape of trapezoid, is formed. Thereby the frame 2 is cup-like shaped. This construction results in that the frame 2 can give the light emerging from the light emitting device 1 directivity, and therefore, the light emerging therefrom can be efficiently utilized. The dimension of the depressed portion 2A of the light emitting device 1 (that is, the inclination of the slope, depth from the opening to the bottom or the like) is configured in a manner that the light can emerge from the light emitting device 1 in the predetermined direction (here, upward direction in the Figure).

On the bottom of the depressed portion 2A, there installed an electrode, not shown in Figs., to be supplied with electric power from the outside of the light emitting device 1, through which electric power can be applied to the blue LED 3.

Furthermore, the reflectance, against all visible-light wavelength, of the inside surface of the depressed portion 2A of the frame 2 is adjusted to be high by metal plating. With this construction, the light irradiated upon the inside surface of the depressed portion 2A of the frame 2 can emerge in the predetermined direction from the light emitting device 1. Here, it is obvious that care should be taken for the metal plating not to short-circuit the electrode.

A blue LED 3 is installed on the bottom of the depressed portion 2A of the frame 2, as a light source. This blue LED 3 is an LED emitting blue light when supplied with electric power. A part of the light emitted from the blue LED 3 is absorbed in the luminescent materials (here, a fluorescent materials) within the green emitting section 4 and the red emitting section 5 as an exciting light. Another part of the light emerges from the light emitting device 1 in the predetermined direction (here, upward direction in the Figure).

The blue LED 3 installed on the bottom of the depressed portion 2A of the frame 2, as mentioned above. It is adhered to the frame 2 using silver paste (that is, adhesive mixed with silver particles) 6 in this embodiment, and thereby the blue LED 3 is installed on the frame 2. This silver paste 6 also serves as a radiator to release heat generated at the blue LED 3.

In addition, a metallic wire 7 for supplying electric power to the blue LED 3 is fixed to the frame 2. In other words, the blue LED 3 and the electrode (not shown in Figs.), installed on the bottom of the depressed portion 2A of the frame 2, are connected by means of wire bonding using the wire 7. By energizing the wire 7, the electric power is supplied to the blue LED 3 and then the blue LED 3 emits blue light.

There are also provided the green emitting section 4 as a first emitting section and a red emitting section 5 as a second emitting section on the bottom of the depressed portion 2A of the frame 2.

The depressed portion 2A is filled up with the green emitting section 4 and the red emitting section 5. The side where the green emitting section 4 and red emitting section 5 are facing to the outside of the light emitting device 1 at the opening of the depressed portion 2A functions as the light exit side 1A, from which the light emerges from the light emitting device 1 in the predetermined direction. In other words, the blue light emitted from the blue LED 3, the green light emitted from the green emitting section 4 and the red light emitted from the red emitting section 5 emerge in the predetermined direction, from this light exit side 1A. In this embodiment, there is no other side through which light emerge from the light emitting device 1, therefore light exit side 1A of the light emitting device 1 also functions as the light-emerging surface $Y_1$ of the light emitting device 1.

The green emitting section 4 consists of green phosphor and transparent resin. The green phosphor is the luminescent material of the green emitting section 4. It is the fluorescent material excited by the blue light emitted from the blue LED 3 and emits green light, the wavelength of which is longer than that of blue light. The transparent resin is a binder of the green emitting section 4. In this embodiment, epoxy resin, which is a kind of synthetic resin that can be passed through by the visible light of all wavelengths, is used as the transparent resin.

The green emitting section 4 is formed to extend from the bottom to the opening of the depressed portion 2A, filling up the left-hand side, in Figs., thereof. In addition, the green emitting section 4 is formed to cover the entire lateral sides of the blue LED 3, which means that the green emitting section 4 is located closer to the blue LED 3 than the red emitting section 5 is. With this construction, the blue light emitted from the blue LED 3 first passes through the green emitting section 4 and then gets to the outside of the light emitting device 1 or to the red emitting section 5.

Further, the green emitting section 4 comprises the first light exit side 4A at the opening of the depressed portion 2A. This first light exit side 4A, which is shaped to be a flat surface, forms the upper surface, in Figs., of the green emitting section 4 and overlap with the flat surface formed from the upper side of the frame 2. The first light exit side 4A is the surface from which the light emitted from the green emitting section 4 emerges to the outside of the light emitting device 1 in the predetermined direction. And the first light exit side 4A is also the surface from which the blue light emitted from the blue LED 3 emerges to the outside. Furthermore, the first light exit side 4A forms the light exit side 1A, together with the after-mentioned second light exit side 5A, from which the light emitted from the light emitting device 1 emerges to the outside. This means that the green emitting section 4 is opened at the light exit side 1A.

On the other hand, the red emitting section 5 consists of red phosphor and transparent resin. The red phosphor is the luminescent material of the red emitting section 5. It is the fluorescent material excited by the blue light emitted from the blue LED 3 and the green light emitted from the green emitting section 4, and emits red light, the wavelength of which is longer than that of green light. The transparent resin is a binder of the red emitting section 5. In this embodiment, epoxy resin, which is a kind of synthetic resin that can be passed through by the visible light, is used as the transparent resin, as is the case with the green emitting section 4.

The red emitting section 5 is formed to extend from the bottom to the opening of the depressed portion 2A, filling up the right-hand side, in Figs., thereof. As mentioned above, the green emitting section 4 is also formed to extend from the bottom to the opening of the depressed portion 2A, and thus this light emitting device 1 is constructed in a manner that the thicknesses (the vertical dimensions, in Figs.) of the green emitting section 4 and the red emitting section 5 are almost the same.

In addition, the blue LED 3 is covered by the green emitting section 4, which means that the red emitting section 5 is located farther to the blue LED 3 than the green emitting section 4 is.

Further, the red emitting section 5, as in the case of the green emitting section 4, comprises the second light exit side 5A at the opening of the depressed portion 2A. This second light exit side 5A, which is shaped to be a flat surface, forms the upper surface, in Figs., of the red emitting section 5 and overlap with the flat surface formed from the upper side of the frame 2. The second light exit side 5A is the surface from which the light emitted from the red emitting section 5 emerges to the outside of the light emitting device 1 in the predetermined direction. And the second light exit side 5A is also the surface from which the blue light emitted from the blue LED 3, and as well as in some cases, the green light emitted from the green emitting section 4 and entered the red emitting section 5 through the boundary surface $X_1$, emerge to the outside. Furthermore, as mentioned above, the second light exit side 5A forms the light exit side 1A, together with the first light exit side 4A, from which the light emitted from the light emitting device 1 emerges to the outside. This means that the red emitting section 5 is opened at the light exit side 1A.

Figure 4A:
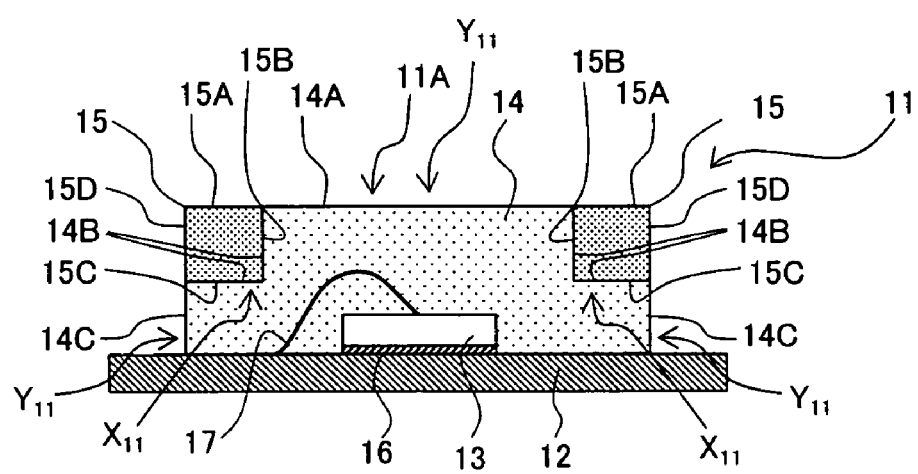
FIG. 4(*a*) and FIG. 4(*b*) are figures illustrating schematically the main part of the light emitting device, as a second embodiment of the present invention.
Figure 4B:
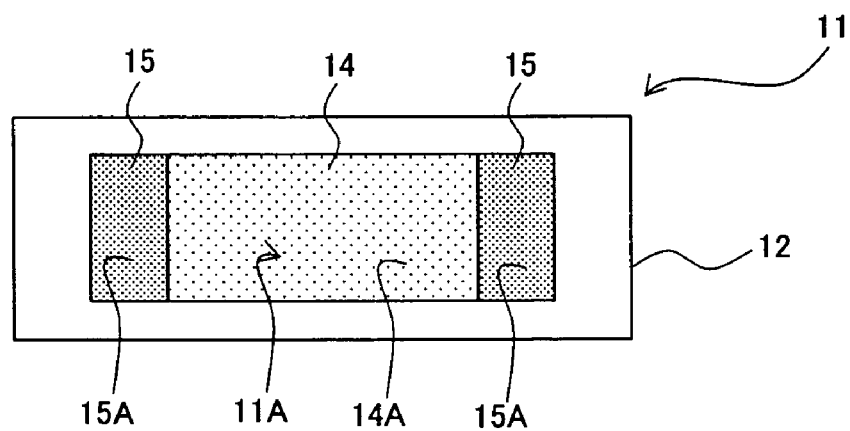
Figure 5A:
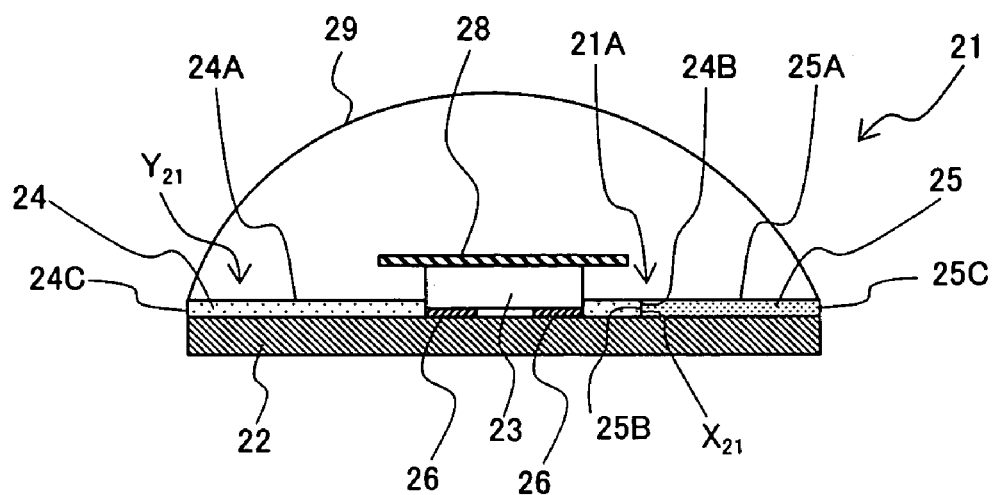
FIG. 5(*a*) and FIG. 5(*b*) are figures illustrating schematically the main part of the light emitting device, as a third embodiment of the present invention.
Figure 5B:
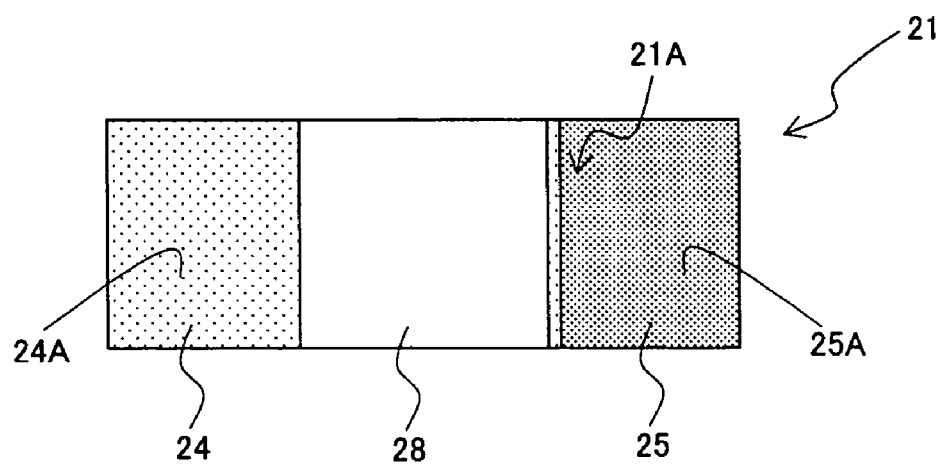

The whole of the right lateral side, in FIG. 4B of the green emitting section 4 is directly in contact with the whole of the left lateral side, in FIG. 5B of the red emitting section 5. These two sides contacting each other, the right lateral side 4B of the green emitting section 4 and the left lateral side 5B of the red emitting section 5, form the identical surface that constructs the boundary surface $X_1$ between the green emitting section 4 and the red emitting section 5, in the light emitting device 1 of the present embodiment. Further, the light emitting device 1 is constructed in a manner that the area of this boundary surface $X_1$ is usually equal to or less than 50%, preferably equal to or less than 30%, of the surface area of the green emitting section 4 (here, it is the sum of the areas of the green emitting section 4 in contact with frame 2, with blue LED 3, with red emitting section 5 and with wire 7, and the area of the opening surface of the green emitting section 4 or the first light exit side 4A).

Moreover, the boundary surface $X_1$ is constructed in a manner that the area thereof is usually equal to or less than 50%, preferably equal to or less than 30%, of the area of the light-emerging surface $Y_1$ (here, it overlaps the light exit side 1A) of the light emitting device 1.

The light emitting device 1 of the present embodiment is constructed in the above-mentioned manner. Thereby, when blue light is emitted from the blue LED 3, a part of it is used as the exciting light for the green emitting section 4, and then green light is emitted from the green emitting section 4. Another part of the blue light emitted from the blue LED 3 is used as the exciting light for the red emitting section 5, and then red light is emitted from the red emitting section 5. In addition, a part of the green light emitted from the green emitting section 4 is absorbed in the red emitting section 5, being used as the exciting light. After all, the blue light, green light and red light, emitted in these ways, emerge from the light exit side 1A in the predetermined direction.

With this construction, the light emitting device 1 can achieve high emission efficiency and color rendering. That is, as the green emitting section 4 and the red emitting section 5 are opened at the light exit side 1A and the area of the boundary surface $X_1$ is set up to be equal to or less than the predetermined value (50%) of the whole surface area of the green emitting section 4, the absorption amount of the light emitted from the green emitting section 4 into the red emitting section 5 can be lowered. Thereby, the emission efficiency of the light emitting device 1 can be enhanced. Moreover, the fluctuation in the optical components of the light emerging from the light emitting device 1 can be reduced, thereby the color reproduction and color rendering of the light emitting device 1 can be also enhanced.

(2) Second Embodiment

FIG. 4(a) and FIG. 4(b) are figures illustrating schematically the main part of the light emitting device, as a second embodiment of the present invention. FIG. 4(a) is a sectional view, and FIG. 4(b) is a top view of it respectively.

As shown in FIG. 4(a) and FIG. 4(b), the light emitting device 11 of the present embodiment comprises a frame 12, a light source or a blue LED (blue emitting section) 13, a first emitting section or a green emitting section 14 and a second emitting section or a red emitting section 15.

The frame 12 is a base, made from resin, for holding the blue LED 13, green emitting section 14 and red emitting section 15. The frame 12 is shaped to be a plate, on the upper side of which the blue LED 13, green emitting section 14 and red emitting section 15 are installed.

On the surface of the frame 12, there installed an electrode, not shown in Figs., to be supplied with electric power from the outside of the light emitting device 11, through which power can be applied to the blue LED 13.

Furthermore, the reflectance, against all visible-light wavelength, of the surface of the frame 12 is adjusted to be high by metal plating. With this construction, the light irradiated upon the surface of the frame 12 can also emerge in the predetermined direction (here, upward direction of Figs.) from the light emitting device 11.

A blue LED 13 is installed on the frame 12, as the light source. Here, the explanation about the blue LED 13 is skipped, as it is similar to the blue LED 3 of the first embodiment and it functions similarly thereto. The blue LED 13 is fixed on the frame 12 using silver paste 16, and the power is supplied to the blue LED 13 through the wire 17, as in the case of the blue LED 3. At this point, the silver paste 16 and wire 17 of the light emitting device 11 have no specific difference from the silver paste 6 and wire 7 respectively.

Furthermore, there provided the green emitting section 14 on the frame 12, as an first emitting section, covering up all lateral sides of the blue LED 13. And there provided the red emitting sections 15, as second emitting sections, at the left and right, in Figs., ends of the top of the green emitting section 14. Specifically speaking, the green emitting section 14 and the red emitting section 15 form a rectangular solid in combination, on both edges of the top thereof the red emitting sections 15 are formed, and the other portion thereof forms the green emitting section 14.

In the light emitting device 11, the predetermined direction in which the light emerges is set up to be upward direction of Figs. Consequently, the surface 11A, formed from the upper surface 14A of the green emitting section 14 and the upper surfaces 15A of the red emitting section 15, functions as the light exit side 11A, through which the light emerges from the light emitting device 11. Accordingly, the blue light emitted from the blue LED 13, the green light emitted from the green emitting section 14 and the red light emitted from the red emitting section 15 emerge in the predetermined direction, from this light exit side 11A. In this regard, the light exit side 11A, formed from the upper surface 14A of the green emitting section 14 and the upper surfaces 15A of the red emitting section 15, is configured to be a single flat surface.

The green emitting section 14 is formed from similar material to the green emitting section 4 of the first embodiment. In addition, the green emitting section 14 is covering the entire lateral sides of the blue LED 13, which means that the green emitting section 14 is located closer to the blue LED 13 than the red emitting section 15 is. With this construction, as in the case of the first embodiment, the blue light emitted from the blue LED 13 passes through the green emitting section 14 first, and then gets to the outside of the light emitting device 11 or to the red emitting section 15.

Further, as mentioned above, the upper surface 14A of the green emitting section 14 faces to the outside of the light emitting device 11, and from this upper surface 14A, the green light emerges in the predetermined direction. This means that the green emitting section 14 is opened at the upper surface 14A, or at the light exit side 11A, which includes the upper surface 14A. The blue light emitted from the blue LED 13 also emerges to the outside from this upper surface 14A.

On the other hand, the red emitting section 15 is formed from similar material to the red emitting section of the first embodiment. In addition, the green emitting section 14 is covering the entire lateral sides of the blue LED 13, which means that the red emitting section 15 is located farther to the blue LED 13 than the green emitting section 14 is.

Further, as mentioned above, the upper surface 15A of the red emitting section 15 faces to the outside of the light emitting device 11, and from this upper surface 15A, the red light emerges in the predetermined direction. This means that the red emitting section 15 is opened at the upper surface 15A, or at the light exit side 11A, which includes the upper surface 15A. The blue light emitted from the blue LED 13, and as well as in some cases, the green light emitted from the green emitting section 14 and entered the red emitting section 15 through the boundary surface $X_{11}$, emerge to the outside from this upper surface 15A.

In the light emitting device 11 of the present embodiment, the green emitting section 14 and the red emitting section 15 are directly in contact with each other. More specifically, the entire surfaces of all the inner lateral sides 15B and all the bottom surfaces 15c of the red emitting section 15 are directly contacting the respectively corresponding surfaces 14B of the green emitting section 14. Accordingly, each of the contact surfaces, where both the left and right inner lateral surfaces 15B and the bottom surfaces 15c of the red emitting section 15 are in touch with the surfaces 14B of the green emitting section 14, forms the boundary surface $X_{11}$. The light emitting device 11 is constructed in a manner that the area of the boundary surface $X_{11}$ (the sum of the areas of all contact surfaces where the inner lateral sides 15B and the bottom surfaces 15C contact the surfaces 14B) is usually equal to or less than 50%, preferably equal to or less than 30%, of the surface area of the green emitting section 14 (here, it is the sum of the areas of the green emitting section 14 in contact with frame 12, with blue LED 13, with red emitting section 15 and with wire 17, the area of the opened upper surface 14A, and the lower lateral sides 14C of the green emitting section 14).

Moreover, the boundary surface $X_{11}$ is constructed in a manner that the area thereof is usually equal to or less than 50%, preferably equal to or less than 30%, of the area of the light-emerging surface $Y_{11}$ of the light emitting device 11. In this embodiment, the light-emerging surface $Y_{11}$ consists of the light exit side 11A (that is, the upper surface 14A of the green emitting section 14 and the upper surfaces 15A of the red emitting section 15), the lower lateral sides 14C of the green emitting section 14 and the outer lateral sides 15D of the red emitting section 15.

The light emitting device 11 of the present embodiment is constructed in the above-mentioned manner. Thereby, when blue light is emitted from the blue LED 13, a part of it is used as the exciting light for the green emitting section 14, and then green light is emitted from the green emitting section 14. Another part of the blue light emitted from the blue LED 13 is used as the exciting light for the red emitting section 15, and then red light is emitted from the red emitting section 15. In addition, a part of the green light emitted from the green emitting section 14 is absorbed in the red emitting section 15, being used as the exciting light. After all, the blue light, green light and red light, emitted in these ways, emerge from the light exit side 11A in the predetermined direction.

With this construction, the light emitting device 11 can achieve high emission efficiency and color rendering. That is, as the green emitting section 14 and the red emitting section 15 are opened at the light exit side 11A and the area of the boundary surface $X_{11}$ is set up to be equal to or less than the predetermined value (50%) of the whole surface area of the green emitting section 14, the absorption amount of the light emitted from the green emitting section 14 into the red emitting section 15 can be lowered. Thereby, the emission efficiency and color rendering of the light emitting device 11 can be enhanced. Moreover, the fluctuation in the optical components of the light emerging from the light emitting device 11 can be reduced, thereby the color reproduction and color rendering of the light emitting device 11 can be also enhanced.

According to the light emitting device 11, the operations and effects similar to the light emitting device 1 of the first embodiment can be also achieved.

(3) Third Embodiment

FIG. 5(a) and FIG. 5(b) are figures illustrating schematically the main part of the light emitting device, as a third embodiment of the present invention. FIG. 5(a) is a sectional view, and FIG. 5(b) is a top view of it respectively. In FIG. 5(b), the closure is not illustrated for the sake of explanatory convenience.

As shown in FIG. 5(a) and FIG. 5(b), the light emitting device 21 of the present embodiment comprises a frame 22, a light source or a blue LED (blue emitting section) 23, a first emitting section or a green emitting section 24, a second emitting section or a red emitting section 25, reflector plate 28 and closure 29.

The frame 22 is a base, made from resin, for holding the blue LED 23, green emitting section 24, red emitting section 25 and closure 29. The frame 22 is shaped to be a plate, on the upper side of which the blue LED 23, green emitting section 24, red emitting section 25 and closure 29 are installed.

On the frame 22, as in the case of the second embodiment, there installed an electrode, not shown in Figs. Furthermore, by the metal plating on the frame 22, the light irradiated upon the surface of the frame 22 can also emerge in the predetermined direction (here, upward direction of the Figure) from the light emitting device 21.

A blue LED 23 is installed on the frame 22, as the light source. Here, the explanation about the blue LED 23 is skipped, as it is similar to the blue LED 3, 13 of the first and second embodiments and it functions similarly thereto. The blue LED 23 is fixed on the frame 22 by means of flip chip bonding using solder bump 26, and the electric power is supplied to the blue LED 23 through the solder bump 26.

In this embodiment, there installed a reflector plate 28 on the top of the blue LED 23, of which undersurface is formed as a mirror. With this construction, the light emerging from the blue LED 23 in the upward direction of Figs. is reflected by the reflector plate 28 and then enters either the green emitting section 24 or the red emitting section 25.

In addition, on the frame 22, there provided a closure 29 covering the whole of the upper portion of the frame 22. This closure 29 is made from the material that can be passed through with at least the blue light emitted from the blue LED 23, green light emitted from the green emitting section 24 and red light emitted from the red emitting section 25.

Furthermore, on the frame 22, there provided the green emitting section 24 as the first emitting section and the red emitting section 25 as the second emitting section, which are formed in film-like shape, having the same film thicknesses. The entire upper surface of the frame 22 is covered by the green emitting section 24 and the red emitting section 25.

In the light emitting device 21, the predetermined direction in which the light emerges is set up to be upward direction of Figs. Consequently, the surface 21A, formed from the upper surface 24A of the green emitting section 24 and the upper surface 25A of the red emitting section 25, functions as the light exit side 21A, through which the light emerges from the light emitting device 21 in the predetermined direction. Accordingly, the blue light emitted from the blue LED 23, the green light emitted from the green emitting section 24 and the red light emitted from the red emitting section 25 emerge in the predetermined direction, from this light exit side 21A. In this regard, the light exit side 21A, formed from the upper surface 24A of the green emitting section 24 and the upper surface 25A of the red emitting section 25, is configured to be a single flat surface. Because of the existence of the reflector plate 28, the light emitted from the blue LED 23 does not emerge directly in the predetermined direction, but emerges to the outside after reflected by the frame 22.

The green emitting section 24 is formed from similar material to the green emitting section 4, 14 of the first and second embodiment, on the frame 22 by film formation. This green emitting section 24 is formed on the frame 22, covering the entire portion where the blue LED 23 and the frame 22 are adhered by flip chip bonding and extending from the left-hand end, in Figs., of the frame 22 to the right-hand side of the blue LED 23. This means that the green emitting section 24 is located closer to the blue LED 23 than the red emitting section 25 is. With this construction, most of the blue light emitted from the blue LED 23 enters the green emitting section 24.

Further, from the upper surface 24A of the green emitting section 24, the green light can emerge to the outside of the light emitting device 21 in the predetermined direction. This means that the green emitting section 24 is opened at the upper surface 24A, or at the light exit side 21A, which includes the upper surface 24A. The blue light emitted from the blue LED 23 and reflected by the frame 22 also emerges to the outside from this upper surface 24A.

On the other hand, the red emitting section 25 is formed from similar material to the red emitting section 5, 15 of the first and second embodiment, on the frame 22 by film formation. This red emitting section 25 is located farther to the blue LED 23 than the green emitting section 24 is, because the green emitting section 24 is formed on the frame 22 extending from the left-hand end, in Figs., of the frame 22 to the right-hand side of the blue LED 23.

Further, from the upper surface 25A of the red emitting section 25, the red light emerges to the outside of the light emitting device 21 in the predetermined direction. This means that the red emitting section 25 is opened at the upper surface 25A, or at the light exit side 21A, which includes the upper surface 25A. The blue light emitted from the blue LED 23 and reflected by the frame 22, and as well as in some cases, the green light emitted from the green emitting section 24 and entered the red emitting section 25 through the boundary surface $X_{21}$, also emerges to the outside from this upper surface 25A.

In the light emitting device 21 of the present embodiment, the green emitting section 24 and the red emitting section 25 are directly in contact with each other. More specifically, the whole right-hand, in Figs., lateral side 24B of the green emitting section 24 and the whole left-hand, in Figs., lateral side 25B of the red emitting section 25 is in contact with each other. These two sides contacting each other, the right lateral side 24B of the green emitting section 24 and the left lateral side 25B of the red emitting section 25, form the identical surface that constructs the boundary surface $X_{21}$ between the green emitting section 24 and the red emitting section 25, in the light emitting device 21 of the present embodiment. Further, the light emitting device 21 is constructed in a manner that the area of this boundary surface $X_{21}$ is usually equal to or less than 50%, preferably equal to or less than 30%, of the surface area of the green emitting section 24 {here, it is the sum of the areas of the green emitting section 24 in contact with frame 22, with blue LED 23 and with red emitting section 25, the area of the upper surface 24A, opened toward outside, of the green emitting section 24, and the lateral sides 24c except for the right lateral side 24B (that is, the boundary surface $X_{21}$)}.

Moreover, the boundary surface $X_{21}$ is constructed in a manner that the area thereof is usually equal to or less than 50%, preferably equal to or less than 30%, of the area of the light-emerging surface $Y_{21}$ of the light emitting device 21. In this embodiment, the light-emerging surface $Y_{21}$ consists of the light exit side 21A (that is, the upper surface 24A of the green emitting section 24 and the upper surfaces 25A of the red emitting section 25), the lateral sides 24C other than the right-hand lateral side 24B (that is, the boundary surface $X_{21}$) of the green emitting section 24 and the lateral sides 25C other than the left-hand lateral side 25B (that is, the boundary surface $X_{21}$) of the red emitting section 25.

The light emitting device 21 of the present embodiment is constructed in the above-mentioned manner. Thereby, when blue light is emitted from the blue LED 23, a part of it is used as the exciting light for the green emitting section 24, and then green light is emitted from the green emitting section 24. Another part of the blue light emitted from the blue LED 23 is used as the exciting light for the red emitting section 25, and then red light is emitted from the red emitting section 25. In addition, a part of the green light emitted from the green emitting section 24 is absorbed in the red emitting section 25, being used as the exciting light. After all, the blue light, green light and red light, emitted in these ways, emerge from the light exit side 21A in the predetermined direction.

With this construction, the light emitting device 21 can achieve high emission efficiency and color rendering. That is, as the green emitting section 24 and the red emitting section 25 are opened at the light exit side 21A and the area of the boundary surface $X_{21}$ is set up to be equal to or less than the predetermined value (50%) of the whole surface area of the green emitting section 24, the absorption amount of the light emitted from the green emitting section 24 into the red emitting section 25 can be lowered. Thereby, the emission efficiency and color rendering of the light emitting device 21 can be enhanced. Moreover, the fluctuation in the optical components of the light emerging from the light emitting device 21 can be reduced, thereby the color reproduction and color rendering of the light emitting device 21 can be also enhanced.

According to the light emitting device 21, the operations and effects similar to the light emitting device 1, 11 of the first and second embodiments can be also achieved.

(4) Fourth Embodiment

Figure 6A:
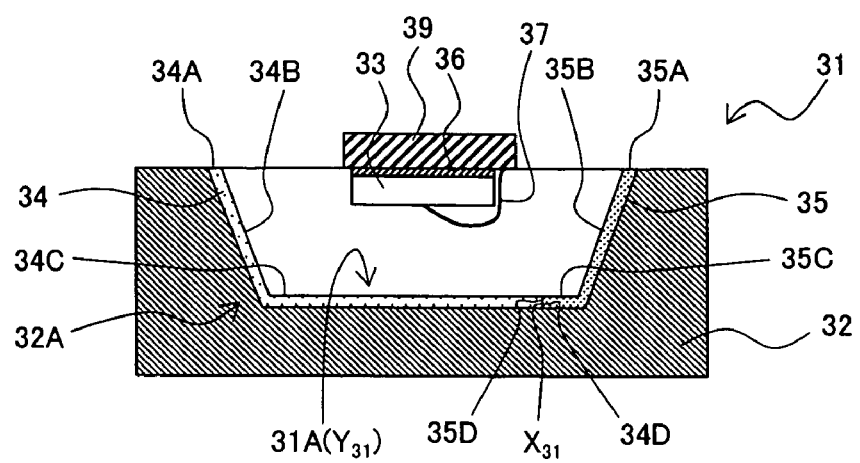
FIG. 6(*a*) and FIG. 6(*b*) are figures illustrating schematically the main part of the light emitting device, as a fourth embodiment of the present invention.
Figure 6B:
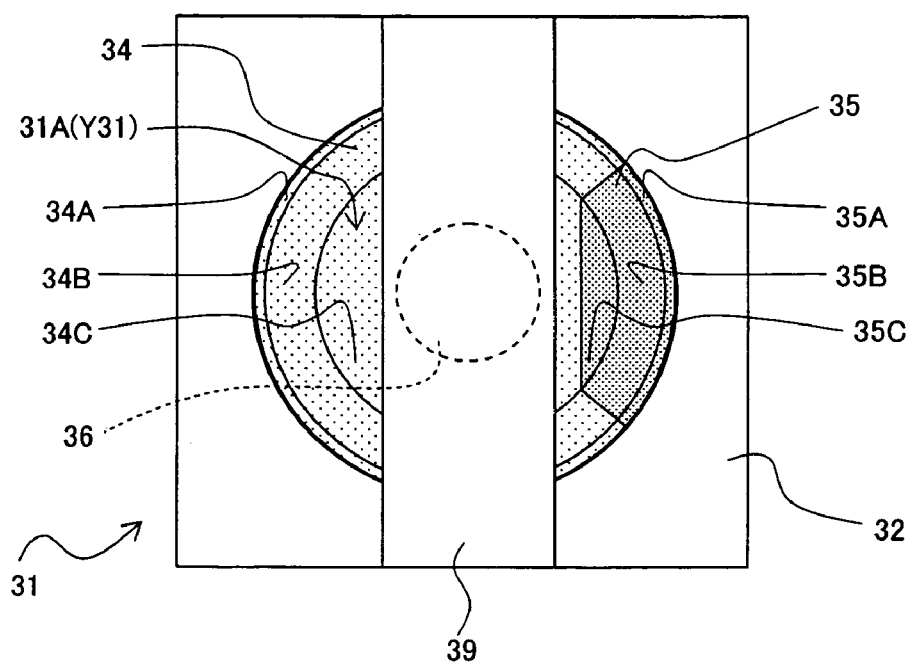

FIG. 6(a) and FIG. 6(b) are figures illustrating schematically the main part of the light emitting device, as a fourth embodiment of the present invention. FIG. 6(a) is a sectional view, and FIG. 6(b) is a top view of it respectively.

As shown in FIG. 6(a) and FIG. 6(b), the light emitting device 31 of the present embodiment comprises a first frame 32, a light source or a blue LED (blue emitting section) 33, a first emitting section or a green emitting section 34, a second emitting section or a red emitting section 35 and a second frame 39.

The first frame 32 is, similar to the frame 2 of the first embodiment, a base made from resin, which is for holding the blue LED 33, green emitting section 34 and red emitting section 35. On the upper side thereof, a depressed portion (a recession) 32A opening upward, in Figs., with a cross-sectional shape of trapezoid, is formed. Thereby it can give the light emerging from the light emitting device 31 directivity, and therefore, the light emerging therefrom can be efficiently utilized, as in the case of the first embodiment.

Furthermore, by the metal plating on the inside surface of the depressed portion 32A, the light irradiated upon the surface of the first frame 32 can emerge in the predetermined direction from the light emitting device 31.

There installed the second frame 39 on the top of the frame 32. This second frame 39 is preferably made from the material that can be passed through with at least the blue light emitted from the blue LED 33, green light emitted from the green emitting section 34 and red light emitted from the red emitting section 35. In this embodiment, the second frame 39 is made from the material that can be passed through with the above-mentioned blue light, green light and red light. The second frame 39 has an electrode, not shown in Figs., through which electric power can be applied to the blue LED 33.

A blue LED 33 is installed at the center of the undersurface of the second frame 39, as the light source. Here, the explanation about the blue LED 33 is skipped, as it is similar to the blue LED 3, 13, 23 of the first to third embodiment and it functions similarly thereto. The blue LED 33 is fixed on the second frame 39 using silver paste 36, and the electric power is supplied to the blue LED 33 through the wire 37. At this point, the silver paste 36 and wire 37 of the light emitting device 31 have no specific difference from the silver paste 6, 16, and wire 7, 17, of the first and second embodiments, respectively.

The space from the bottom of the depressed portion 32A of the first frame 32 to the undersurface of the second frame 39 is molded with the material (not shown in Figs.) which can be passed through with at least blue light emitted from the blue LED 33, green light emitted from the green emitting section 34 and red light emitted from the red emitting section 35.

Furthermore, on the first frame 32, there provided the green emitting section 34 as the first emitting section and the red emitting section 35 as the second emitting section, which are formed in film-like shape, having the same film thicknesses. The entire inner surface of the depressed portion 32A of the first frame 32 is covered by the green emitting section 34 and the red emitting section 35.

In the light emitting device 31, the predetermined direction in which the light emerges is set up to be upward direction of Figs. Consequently, the surface 31A, which is formed from the upper surface 34A of the green emitting section 34 at the opening of the depressed portion 32A, the upper surface 34B of the green emitting section 34 at the left-hand, in Figs., slope of the depressed portion 32A, the upper surface 34C of the green emitting section 34 at the bottom of the depressed portion 32A, the upper surface 35A of the red emitting section 35 at the opening of the depressed portion 32A, the upper surface 35B of the red emitting section 35 at the right-hand, in Figs., slope of the depressed portion 32A and the upper surface 35C of the red emitting section 35 at the bottom of the depressed portion 32A, functions as the light exit side 31A, through which the light emerges from the light emitting device 31 in the predetermined direction. Accordingly, the blue light emitted from the blue LED 33, the green light emitted from the green emitting section 34 and the red light emitted from the red emitting section 35 emerge in the predetermined direction, from this light exit side 31A. Because of the existence of the silver paste 36, the light emitted from the blue LED 33 does not emerge directly in the predetermined direction, but emerges to the outside after reflected by the first frame 32. In this embodiment, there is no other surface where light emerge from the light emitting device 31 than this light exit side 31A. Therefore, the light exit side 31A of the light emitting device 31 also functions as the light-emerging surface $Y_{31}$ of the light emitting device 31.

The green emitting section 34 is formed from similar material to the green emitting section 4, 14, 24 of the first to third embodiment, on the surface of the depressed portion 32A of the first frame 32 by film formation. This green emitting section 34 is formed on the surface of the depressed portion 32A, extending from the left-hand end, in Figs., of the depressed portion 32A to the right-hand side, in Figs., of the center thereof (in this embodiment, that is, to more rightward position than that corresponding to the right end of the blue LED 33). This means that the green emitting section 34 is located closer to the blue LED 33 than the red emitting section 35 is. With this construction, more than half of the blue light emitted from the blue LED 33 enters the green emitting section 34.

Further, from the upper surface 34A of the green emitting section 34 at the opening of the depressed portion 32A, the upper surface 34B of the green emitting section 34 at the left-hand, in Figs., slope of the depressed portion 32A and the upper surface 34C of the green emitting section 34 at the bottom of the depressed portion 32A, the green light can emerge to the outside of the light emitting device 31 in the predetermined direction. This means that the green emitting section 34 is opened at these surfaces 34A, 34B, 34C, or at the light exit side 31A, which includes these surfaces 34A, 34B, 34C. The blue light emitted from the blue LED 33 and reflected by the first frame 32 also emerges to the outside from these surfaces 34A, 34B, 34C.

On the other hand, the red emitting section 35 is formed from similar material to the red emitting section 5, 15, 25 of the first to third embodiment, on the surface of the depressed portion 32A of the first frame 32 by film formation. This red emitting section 35 is formed on the surface of the depressed portion 32A, at the portion where the green emitting section 34 is not formed. This means that the red emitting section 35 is located far from the blue LED 33 than the green emitting section 34 is, because the green emitting section 34 is extending from the left-hand end, in Figs., of the depressed portion 32A of the first frame 32 to the right-hand side, in Figs., of the center thereof. With this construction, the blue light emitted from the blue LED 33 enters the green emitting section 34 than the red emitting section 35.

Further, from the upper surface 35A of the red emitting section 35 at the opening of the depressed portion 32A, the upper surface 35B of the red emitting section 35 at the right-hand, in Figs., slope of the depressed portion 32A and the upper surface 35C of the red emitting section 35 at the bottom of the depressed portion 32A, the red light can emerge to the outside of the light emitting device 31 in the predetermined direction. This means that the red emitting section 35 is opened at these surfaces 35A, 35B, 35C, or at the light exit side 31A, which includes these surfaces 35A, 35B, 35C. The blue light emitted from the blue LED 33 and reflected by the first frame 32, and as well as in some cases, the green light emitted from the green emitting section 34 and entered the red emitting section 35 through the boundary surface $X_{31}$, also emerges to the outside from these surfaces 35A, 35B, 35C.

In the light emitting device 31 of the present embodiment, the green emitting section 34 and the red emitting section 35 are directly in contact with each other. More specifically, the whole right-hand, in Figs., lateral side 34D of the green emitting section 34 and the whole left-hand, in Figs., lateral side 35D of the red emitting section 35 is in contact with each other. These two sides contacting each other, the right lateral side 34D of the green emitting section 34 and the left lateral side 35D of the red emitting section 35, form the identical surface that constructs the boundary surface $X_{31}$ between the green emitting section 34 and the red emitting section 35, in the light emitting device 31 of the present embodiment. Further, the light emitting device 31 is constructed in a manner that the area of this boundary surface $X_{31}$ is usually equal to or less than 50%, preferably equal to or less than 30%, of the surface area of the green emitting section 34 (here, it is the sum of the areas of the upper surface 34A of the green emitting section 34 at the opening of the depressed portion 32A, the upper surface 34B of the green emitting section 34 at the left-hand, in Figs., slope of the depressed portion 32A, the upper surface 34C of the green emitting section 34 at the bottom of the depressed portion 32A, the right-hand, in Figs., side 34D of the green emitting section 34 and the surface where the green emitting section 34 is in contact with the first frame 32).

Moreover, the boundary surface $X_{31}$ is constructed in a manner that the area thereof is usually equal to or less than 50%, preferably equal to or less than 30%, of the area of the light-emerging surface $Y_{31}$ (identical with the light exit side 31A in this embodiment) of the light emitting device 31.

The light emitting device 31 of the present embodiment is constructed in the above-mentioned manner. Thereby, when blue light is emitted from the blue LED 33, a part of it is used as the exciting light for the green emitting section 34, and then green light is emitted from the green emitting section 34. Another part of the blue light emitted from the blue LED 33 is used as the exciting light for the red emitting section 35, and then red light is emitted from the red emitting section 35. In addition, a part of the green light emitted from the green emitting section 34 is absorbed in the red emitting section 35, being used as the exciting light. After all, the blue light, green light and red light, emitted in these ways, emerge from the light exit side 31A (equal to the light-emerging surface $Y_{31}$) in the predetermined direction.

With this construction, the light emitting device 31 can achieve high emission efficiency and color rendering. That is, as the green emitting section 34 and the red emitting section 35 are opened at the light exit side 31A and the area of the boundary surface $X_{31}$ is set up to be equal to or less than the predetermined value (50%) of the whole surface area of the green emitting section 34, the absorption amount of the light emitted from the green emitting section 34 into the red emitting section 35 can be lowered. Thereby, the emission efficiency of the light emitting device 31 can be enhanced. Moreover, the fluctuation in the optical components of the light emerging from the light emitting device 31 can be reduced, thereby the color reproduction and color rendering of the light emitting device 31 can be also enhanced.

According to the light emitting device 31, the operations and effects similar to the light emitting device 1, 11, 21 of the first to third embodiments can be also achieved.

[5. Use Application of Light Emitting Device]

There is no limitation to use application of the light emitting device of the present invention, and it can be applied to any use for utilizing light. A part of the specific examples of its use application are a lighting system, backlight unit for a display, display and so on.

There is no specific restriction when the light emitting device of the present invention is used as a lighting system, and it can be used in various modes of use as a light emitting device, for example, photoflashes, lighting devices for video cameras, indoor and outdoor lighting fixtures. Pay attention to that, in the light emitting device of the present invention, although the wavelengths (or the color) of the lights emitted from the first emitting section and second emitting section are different from each other, the lights emerging from the light emitting device will spread sufficiently after it left the light emitting device and percepted visually in a state where the lights from the light source, first emitting section and second emitting section are well mixed. Thereby, when we observe them by visual perception, the lights can be as the intended color, without being sorted into their wavelength components. By using the light emitting device of the present invention as a lighting system, light with high color rendering can be applied, with high emission efficiency.

The light emitting device of the present invention can be also used as a backlight unit, utilizing optical elements, for example optical waveguides, in combination. One specific application example of the light emitting device of the present invention is a backlight unit for the cellular phone display, which is installed with a backlight unit for illuminating the liquid crystal display from the backside.

Figure 7:
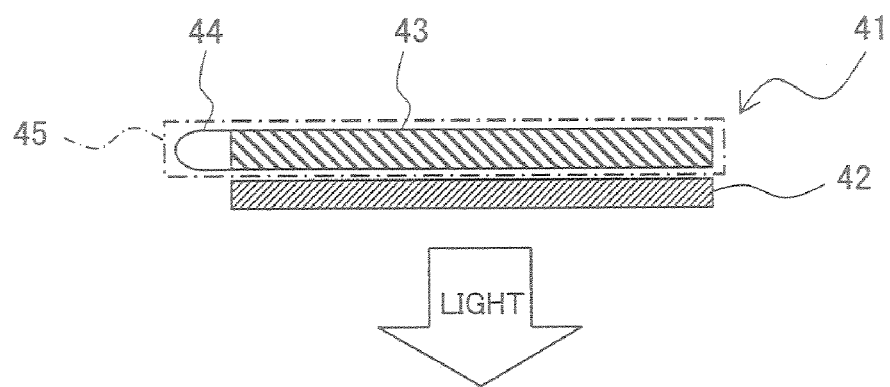
FIG. 7 is a schematical sectional view of the main part of a display, for illustrating an example of a backlight unit using the light emitting device of the present invention.

FIG. 7 is a schematical sectional view of the main part of a cellular phone display 41, for illustrating an example of a backlight unit using the light emitting device of the present invention. As shown in FIG. 7, on the backside of the liquid crystal display 42, an optical waveguide 43, having the size corresponding to the entire backside of the liquid crystal display 42, is installed. This optical waveguide 43 is a plate-like optical element, manufactured from the transparent material that can be passed through with the lights of all visible wavelengths, on the lateral side of which the light emitting device 44 is installed. This light emitting device 44 is installed in a manner that the light emerging therefrom can enter the optical waveguide 43. And the backlight unit for a display 45 consists of this optical waveguide 43 and the light emitting device 44. With this construction, the light emerging from the light emitting device 44 enters the optical waveguide 43, and then emerge from a surface of the optical waveguide 43 facing the liquid crystal display 42, toward the liquid crystal display. Thereby the liquid crystal display 42 can be illuminated brightly. At this point, although the wavelengths (or colors) of the lights emitted from the first emitting section and second emitting section of the light emitting device 44 are different from each other, as the lights emerging from the light emitting device 44 are mixed and homogenized within the optical waveguide 43, there is no possibility of irregularity in color on illuminating the liquid crystal display 42.

The light emitting device of the present invention is sometimes used as a backlight, which illuminates directly a liquid crystal display from the backside, for example when it is used for a relatively large type of display. Even in that case, there is no possibility of irregularity in color, as the lights emerging from the light emitting device are mixed and homogenized on the way to the liquid crystal display.

In this regard, diffusion plates, light diffusion layer or the like can be used to spread the light emerging from the light emitting device, for the purpose of mixing and homogenizing the wavelength components of the light emerging from the light emitting device more surely. The method like this can be preferably used for the use application that does not allow even a small irregularity in luminescent color, for example for an indicator of an audiovisual apparatus.

As mentioned above, by using the light emitting device of the present invention as a backlight or backlight unit for a display, it is possible to propose a display with high color reproduction and high emission efficiency (luminance).

EXAMPLES

Example 1

In the first example, we manufactured a light emitting device with a similar construction to the above-mentioned light emitting device of the first embodiment of the present invention, and evaluated its emission efficiency and color rendering. The reference letters of the components in the first and after-mentioned second examples, which have corresponding portions that are illustrated in FIG. 3(*a*) and FIG. 3(*b*), will be shown in parenthesis, if necessary.

First we had ready the frame (2), formed with a cup-shaped depressed portion (2A), on the bottom of which is patterned with an electrode. And then we bonded at the bottom of the depressed portion (2A), the light-emitting diode (3), as a light source for emitting the light with wavelength of 450 nm to 470 nm, using adhesive of silver paste (6), by means of die bonding. At this point, considering the release of heat generated at the light-emitting diode (3), the silver paste (6), used for the die bonding, was applied thinly and evenly. After hardening the silver paste by 2-hour heating at 150 degrees C., the light-emitting diode and the electrode on the frame are connected by wire bonding. Gold wire of 25-μm diameter was used for the wire (7).

In this example, as the luminescent material of the first emitting section (4), a phosphor represented by the formula of $Ca_{2.97}Ce_{0.03}Sc_2Si_3O_{12}$ was used. This phosphor absorbs the light emitted from the light-emitting diode (3), and then the light of 470 nm to 690 nm wavelength emerges therefrom.

As the luminescent material of the second emitting section (5), a phosphor represented by the formula of $Ca_{0.992}AlSiEu_{0.008}N_{2.85}O_{0.15}$ was used. This phosphor absorbs the light emitted from the light-emitting diode (3) and the first emitting section (4), and then the light of 540 nm to 760 nm wavelength emerges therefrom.

The first slurry is prepared by mixing the above-mentioned luminescent material (or, $Ca_{2.97}Ce_{0.03}Sc_2Si_3O_{12}$) of the first emitting section (4) into cilicone resin. In this first slurry, the component ratio between the luminescent material and silicone resin is set up to be 15:85 (weight ratio).

The second slurry is prepared by mixing the luminescent material (or, $Ca_{0.992}AlSiEu_{0.008}N_{2.85}O_{0.15}$) of the second emitting section (5) into silicone resin. In this second slurry, the component ratio between the luminescent material and silicone resin is set up to be 5:95 (weight ratio).

After a spacer is inserted, for the first slurry not to intrude into the portion on the depressed portion (2A) where the second slurry should be fulfilled, or the portion formed with the second emitting section (5), the first slurry was injected into the depressed portion (2A) of the frame (2) and hardened by heating. Thereby, the first emitting section (4) was formed. Next, after removing the spacer, the second slurry was injected into the rest of the depressed portion and hardened by heating. Thereby, the second emitting section (5) was formed. At that point, as in the case of the light emitting device (1) of the first embodiment of the present invention as shown in FIG. 3(a) and FIG. 3(b), the first emitting section (4) and the second emitting section (5) were formed to extend from the bottom to the opening of the depressed portion (2A) respectively, and the first emitting section (4) was constructed to cover the whole lateral sides of the light-emitting diode (3). Therefore, the first emitting section (4) was located closer to the light-emitting diode (3) than the second emitting section (5) is.

The ratio between the luminescent materials of the first emitting section (4) and second emitting section (5) was set up in a manner that the light emerging from the light emitting device would be white light.

Following the above procedure, a light emitting device was manufactured.

In this light emitting device, the first emitting section (4) and second emitting section (5) are facing the outside of the light emitting device at the opening of the depressed portion (2A) respectively. The surfaces of the first emitting section (4) and second emitting section (5), which face the outside, form the light exit side (1A) of the light emitting device of the present example. This means that the first emitting section (4) and second emitting section (5) are opened at the light exit side (1A) respectively.

The area of the boundary surface ($X_1$) between the first emitting section (4) and the second emitting section (5), the surface area of the first emitting section (4) and the area of the light-emerging surface ($Y_1$) of the light emitting device were decided by measuring the size of each portion of the light emitting device and calculating by the size measured. The results are shown in Table 1.

Then we made this light emitting device emit light by applying electric power of 0.07 W to the light-emitting diode (3). At that time, by measuring the emission spectrum of the light emerging from the light emitting device using an integrating sphere, the entire luminous flux, chromaticity and color rendering were measured. The results are shown in Table 1. In this regard, the average amount Ra, calculated by R1 to R8 according to [JIS Z 8726] was adopted for the color rendering. In addition, in Table 1, the chromaticity (x/y) represents the chromatic coordinate.

Example 2

We manufactured a light emitting device in a similar procedure to the first example, other than that the phosphor represented by the formula of $Ca_{0.99}Ce_{0.01}Sc_2O_4$ was used for a luminescent material. Then we decided the area of the boundary surface ($X_1$) between the first emitting section (4) and the second emitting section (5), the surface area of the first emitting section (4), and the area of the light-emerging surface ($Y_1$) of the light emitting device, as well as the entire luminous flux, chromaticity and color rendering of the light emerging from the light emitting device, on emission of the light emitting device. The results are shown in Table 1. In also this light emitting device, the first emitting section (4) and second emitting section (5) are facing the outside of the light emitting device at the opening of the depressed portion (2A) respectively. The surfaces of the first emitting section (4) and second emitting section (5), which face the outside, form the light exit side (1A) of the light emitting device of the present example. This means that the first emitting section (4) and second emitting section (5) are opened at the light exit side (1A) respectively.

Comparative Example 1

Figure 8:
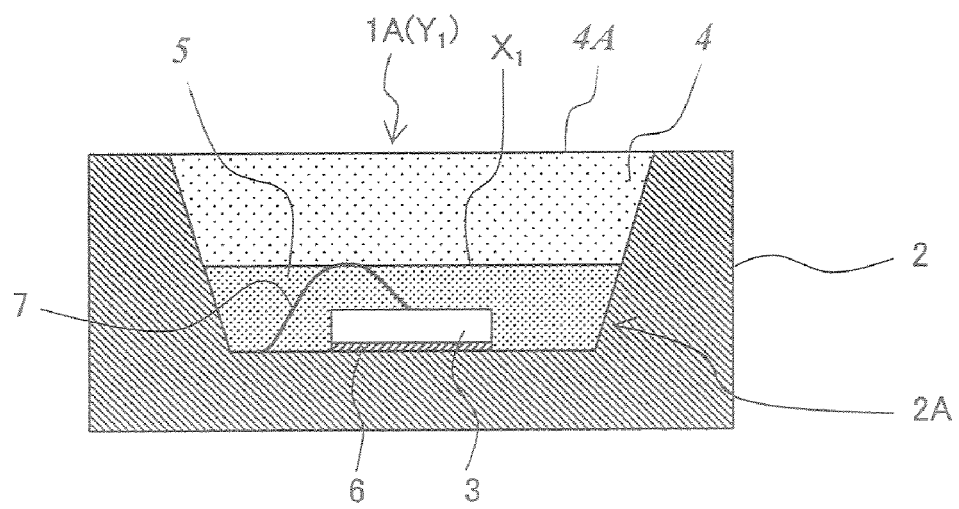
FIG. 8 is a schematical sectional view of the light emitting device of a comparative example 1.

We manufactured a light emitting device in a similar procedure to the example 1, other than that, instead of forming the first emitting section (4) and second emitting section (5) respectively to extend from the bottom to the opening of the depressed portion (2A), the second emitting section (5) is formed to cover the entire light-emitting diode (3) at the bottom of the depressed portion (2A), and on the top of the second emitting section (5), {that is, at the opening-side of the depressed portion (2A),} the first emitting section (4) is formed to cover the entire upper portion of the second emitting section (5) as shown in FIG. 8.

FIG. 8 is a schematical and cross-sectional view of the light emitting device of the first comparative example. The reference letters of the portions, which have corresponding components that are illustrated in FIG. 3(a) and FIG. 3(b), will be put with similar reference letters to them in FIG. 3(a) and FIG. 3(b).

In this light emitting device, just the first emitting section (4) is facing the outside at the light exit side (1A), which is positioned at the opening of the depressed portion (2A). The second emitting section (5) is covered by the first emitting section (4) at the top thereof. This means that the second emitting section (5) is not opened at the light exit side (1A).

Then we decided, as in the case of example 1, the area of the boundary surface ($X_1$) between the first emitting section (4) and the second emitting section (5), the surface area of the first emitting section (4), and the area of the light-emerging surface ($Y_1$) of the light emitting device, as well as the entire luminous flux, chromaticity and color rendering of the light emerging from this light emitting device, on emission of this light emitting device. The results are shown in Table 1.

Comparative Example 2

We manufactured a light emitting device in a similar procedure to the first example, other than that, instead of forming the first emitting section and second emitting section at the depressed portion of the frame, slurry, made from phosphor represented by the formula of $(Y_{0.8}Ce_{0.1}Tb_{0.1})_3Al_5O_{12}$ and silicon resin is injected and hardened by heating, so as to form a single emitting section.

Then we decided, as in the case of example 1, the area of the light-emerging surface of the light emitting device, as well as the entire luminous flux, chromaticity and color rendering of the light emerging from this light emitting device, on emission of this light emitting device. The results are shown in Table 1. However, the area of the boundary surface and first emitting section cannot be decided, as the light emitting device of comparative example 2 has just a single emitting section.

TABLE 1

| | Entire luminous flux (lm) | Chromaticity (x/y) | Ra | Boundary surface area ($mm^2$) | Surface area of 1st emitting section ($mm^2$) | Area of light-emerging surface ($mm^2$) |
|---|---|---|---|---|---|---|
| Example 1 | 1.7 | 0.31/0.33 | 91 | 2.5 | 17.0 | 7.1 |
| Example 2 | 1.7 | 0.32/0.33 | 91 | 2.5 | 17.0 | 7.1 |
| Comparative example 1 | 1.5 | 0.31/0.33 | 91 | 5.3 | 18.3 | 7.1 |
| Comparative example 2 | 2.3 | 0.31/0.31 | 79 | — | — | 7.1 |

As can be understood by Table 1, light with higher luminous flux than that of comparative example 1 can emerge, from the light emitting device of examples 1 and 2, of which the first emitting section and second emitting section are opened at the light exit side, and of which the boundary surface area between the first emitting section and second emitting section is equal to and less than 50% of the surface area of the first emitting section. Consequently, it can be understood that the light emitting device of examples 1 and 2 can achieve higher emission efficiency than the light emitting device of comparative example 1.

In can be also understood that the light emitting device of examples 1 and 2 can have higher Ra value than the light emitting device of comparative example 2, which cannot be content with the above-mentioned condition. Consequently, it can be understood that the light emitting device of examples 1 and 2 can achieve higher color rendering than the light emitting device of comparative example 2.

As mentioned above, though a light emitting device that is superior in both the emission efficiency and color rendering could not be proposed in the conventional art, it was confirmed that a light emitting device that is superior in both the emission efficiency and color rendering can be realized as a result of the present invention, by the examples 1 and 2.

INDUSTRIAL APPLICABILITY

The present invention can be used in any fields utilizing light. For example, it is suitably used for not only lighting systems for both indoor and outdoor use but also display apparatuses of various electronics devices, such as a cellular phone, consumer electronics, display for outdoor installation or the like.

Although the present invention has been described particularly in its specific modes, it is obviously understood by those skilled in the art that various changes may be made without departing from the aim and scope of the present invention.

This application is based on Japanese Patent Application filed on Jun. 30, 2004 (Tokugan 2004-194153), and the whole of it is cited by referring it.

The invention claimed is:

1. A light emitting device comprising:
   at least one light source;
   at least one first emitting section having at least one sort of luminescent material that emits light including a wavelength component that is longer than that of the light emitted from said light source when excited by the light emitted from said light source;
   at least one second emitting section having at least one sort of luminescent material that emits light including a wavelength component that is longer than that of the light emitted from said first emitting section when excited by the light emitted from said light source and said first emitting section; and
   at least one light exit side out of which the light emitted from said light source, said first light-emitting section and said second light-emitting section emerges to the outside;
   wherein said first emitting section and said second emitting section are opened at said light exit side, and
   the area of the boundary surface between said first emitting section and said second emitting section is equal to or less than fifty percent of the surface area of said first emitting section,
   wherein the light exit side of the opened part of the first emitting section emits to the outside in a predetermined direction light of a wavelength corresponding the wavelength of the light source and of a wavelength corresponding to the light emitted by the first emitting section; and
   wherein the light exit side of the opened part of the second emitting section emits to the outside in the predetermined direction light of a wavelength corresponding the wavelength of the light source, of a wavelength corresponding to the light emitted by the first emitting section, and of a wavelength corresponding to the light emitted by the second emitting section.

2. The light emitting device as defined in claim 1, wherein the area of the boundary surface is equal to or less than fifty percent of the whole area of the light-emerging surface.

3. The light emitting device as defined in claim 1, wherein said first emitting section is closer to said light source than said second emitting section is.

4. A lighting system, comprising the light emitting device as defined in claim 1.

5. A backlight for a display, comprising the light emitting device as defined in claim 1 and an optical waveguide.

6. A display, comprising the light emitting device as defined in claim 1 and a liquid crystal display.

7. The light emitting device of claim 1, wherein the at least one first emitting section and the at least one second emitting section have at least one contact side.

8. The light emitting device of claim , wherein the at least one first emitting section and the at least one second emitting section have at least two contact sides.

9. The light emitting device of claim 1, further comprising at least one frame to which the at least one light source is attached.

10. The light emitting device of claim 1, wherein the at least one first emitting section and the at least one second emitting section are imbedded into a frame and only the upper sides of the first emitting section and the second emitting section are exposed to the outside of the device.

11. The light emitting device of claim 9, wherein the light source is imbedded into the at least one first emitting section and is located at the bottom of the first emitting section which contacts the frame.

12. The light emitting device of claim 9, wherein the at least one first emitting section and the at least one second emitting section form a rectangular solid in combination, said rectangular solid is disposed on the top of the at least one frame, and the light source is located on the top of the at least one frame and is surrounded from the top and the lateral sides by the at least one first emitting section.

13. The light emitting device of claim 9, wherein the at least one first emitting section and the at least one second emitting section are formed in a film-like shape on the top of the at least one frame formed in a plate-like shape, wherein the first emitting section and the second emitting section films have the same thickness and do not overlap, and wherein the light source is attached to the top of the at least one frame and is partially imbedded into the at least one first emitting section.

14. The light emitting device of claim 1, comprising at least two frames, wherein the first frame has a depressed recession-like portion having the at least one first emitting section and the at least one second emitting section disposed in a film-like shape on the bottom and the lateral sides of the depressed portion of the first frame, and wherein the light source is attached to the second frame connected to the top of the first frame.

15. A light emitting device comprising:
at least one light source;
at least one first emitting section having at least one sort of luminescent material that emits light including a wavelength component that is longer than that of the light emitted from said light source when excited by the light emitted from said light source;
at least one second emitting section having at least one sort of luminescent material that emits light including a wavelength component that is longer than that of the light emitted from said first emitting section when excited by the light emitted from said light source and said first emitting section; and
at least one light exit side out of which the light emitted from said light source, said first light-emitting section and said second light-emitting section emerges to the outside;
wherein said first emitting section and said second emitting section are opened at said light exit side, and
the area of the boundary surface between said first emitting section and said second emitting section is equal to or less than fifty percent of the surface area of said first emitting section,
wherein the lights from said first emitting section and said second emitting section are mixed after being emitted from said light emitting device, and an observer visualizes the mixed light of an intended color without the emitted light being sorted into wavelength components.

16. The light emitting device as defined in claim 15, wherein the area of the boundary surface is equal to or less than fifty percent of the whole area of the light-emerging surface.

17. The light emitting device as defined in claim 15, wherein said first emitting section is closer to said light source than said second emitting section is.

18. A lighting system, comprising the light emitting device as defined in claim 15.

19. A backlight for a display, comprising the light emitting device as defined in claim 15 and an optical waveguide.

20. A display, comprising the light emitting device as defined in claim 15 and a liquid crystal display.

21. The light emitting device of claim 15, wherein the at least one first emitting section and the at least one second emitting section have at least one contact side.

22. The light emitting device of claim 15, wherein the at least one first emitting section and the at least one second emitting section have at least two contact sides.

23. The light emitting device of claim 15, further comprising at least one frame to which the at least one light source is attached.

24. The light emitting device of claim 15, wherein the at least one first emitting section and the at least one second emitting section are imbedded into a frame and only the upper sides of the first emitting section and the second emitting section are exposed to the outside of the device.

25. The light emitting device of claim 23, wherein the light source is imbedded into the at least one first emitting section and is located at the bottom of the first emitting section which contacts the frame.

26. The light emitting device of claim 23, wherein the at least one first emitting section and the at least one second emitting section form a rectangular solid in combination, said rectangular solid is disposed on the top of the at least one frame, and the light source is located on the top of the at least one frame and is surrounded from the top and the lateral sides by the at least one first emitting section.

27. The light emitting device of claim 23, wherein the at least one first emitting section and the at least one second emitting section are formed in a film-like shape on the top of the at least one frame formed in a plate-like shape, wherein the first emitting section and the second emitting section films have the same thickness and do not overlap, and wherein the light source is attached to the top of the at least one frame and is partially imbedded into the at least one first emitting section.

28. The light emitting device of claim 15, comprising at least two frames, wherein the first frame has a depressed recession-like portion having the at least one first emitting section and the at least one second emitting section disposed in a film-like shape on the bottom and the lateral sides of the depressed portion of the first frame, and wherein the light source is attached to the second frame connected to the top of the first frame.

* * * * *